US010490037B1

(12) United States Patent
Fisher

(10) Patent No.: US 10,490,037 B1
(45) Date of Patent: Nov. 26, 2019

(54) ALARM SCREEN WITH EMBEDDED WIRELESS TRANSMITTER

(71) Applicant: Robert D. Fisher, Sherman Oaks, CA (US)

(72) Inventor: Robert D. Fisher, Sherman Oaks, CA (US)

( * ) Notice: Subject to any disclaimer, the term of this patent is extended or adjusted under 35 U.S.C. 154(b) by 0 days.

(21) Appl. No.: 16/365,211

(22) Filed: Mar. 26, 2019

Related U.S. Application Data

(60) Provisional application No. 62/695,431, filed on Jul. 9, 2018.

(51) Int. Cl.
*G08B 13/12* (2006.01)
*G01R 19/15* (2006.01)
*G08B 13/22* (2006.01)
*G08B 3/10* (2006.01)
*G08B 5/22* (2006.01)

(52) U.S. Cl.
CPC ............ *G08B 13/12* (2013.01); *G01R 19/15* (2013.01); *G08B 3/1016* (2013.01); *G08B 5/223* (2013.01); *G08B 13/22* (2013.01)

(58) Field of Classification Search
CPC ........ G08B 13/00; G08B 13/04; G08B 13/08; G08B 13/12; G08B 13/22; G08B 3/1016; G08B 5/223
USPC .............. 340/541, 545.1, 545.7, 545.8, 657; 160/10, 374
See application file for complete search history.

(56) References Cited

U.S. PATENT DOCUMENTS

| | | | |
|---|---|---|---|
| 3,051,935 A | 8/1962 | Wilson | |
| 4,146,293 A | 3/1979 | Mutton | |
| 4,232,310 A | 11/1980 | Wilson | |
| 4,293,778 A | 10/1981 | Williams | |
| 4,814,750 A | 3/1989 | Abramson | |
| 4,843,375 A | 6/1989 | Riordan | |
| 5,005,000 A | 4/1991 | Riordan | |
| 5,594,418 A * | 1/1997 | Martin | G08B 13/126 200/61.93 |
| 5,610,582 A | 3/1997 | Zahn, Jr. | |
| 2008/0284596 A1* | 11/2008 | Montague | E06B 9/01 340/545.8 |
| 2014/0361896 A1* | 12/2014 | Sibley | G08B 13/08 340/546 |

\* cited by examiner

*Primary Examiner* — Hung T Nguyen
(74) *Attorney, Agent, or Firm* — Makoui Law, PC; Ali Makoui

(57) ABSTRACT

An alarm screen comprises a frame that has a hollow interior. The alarm screen comprises a mesh that is attached to the frame. The alarm screen comprises a detection wire for carrying electric current, where at least a portion of the detection wire is woven through or overlaid on the mesh. The alarm screen comprises a processing unit embedded in the hollow interior of the frame. The alarm screen comprises a wireless transmitter embedded in the hollow interior of the frame and communicatively coupled to the processing unit. The processing unit is configured to detect that no current is carried through the detection wire and to send a signal to the wireless transmitter. The wireless transmitter is configured to receive signals from the processing unit and wirelessly transmit the signals received from the processing unit.

20 Claims, 27 Drawing Sheets

US 10,490,037 B1

ALARM SCREEN WITH EMBEDDED WIRELESS TRANSMITTER

CLAIM OF BENEFIT TO PRIOR APPLICATIONS

This application claims the benefit of U.S. Provisional Patent Application Ser. No. 62/695,431, filed on Jul. 9, 2018. The contents of U.S. Provisional Patent Application 62/695,431 are hereby incorporated by reference.

TECHNICAL FIELD

The present embodiments relate to alarm systems for securing buildings and structures. In particular, the present embodiments relate to improvements in the functionality of alarm screens covering building openings such as doors and windows.

BACKGROUND

Screens installed behind doors and windows allow for fresh air to come into a building and prevents insects and other animals from entering the building. Alarm screens are used to generate an alarm when an intruder attempts to gain access into the building through a screen.

BRIEF DESCRIPTION OF THE DRAWINGS

The various embodiments of the present embodiments now will be discussed in detail with an emphasis on highlighting the advantageous features. These embodiments depict the novel and non-obvious of entry detection screens with embedded wireless transmitter shown in the accompanying drawings, which are for illustrative purposes only. These drawings include the following figures, in which like numerals indicate like parts.

DETAILED DESCRIPTION

Figure 1A:
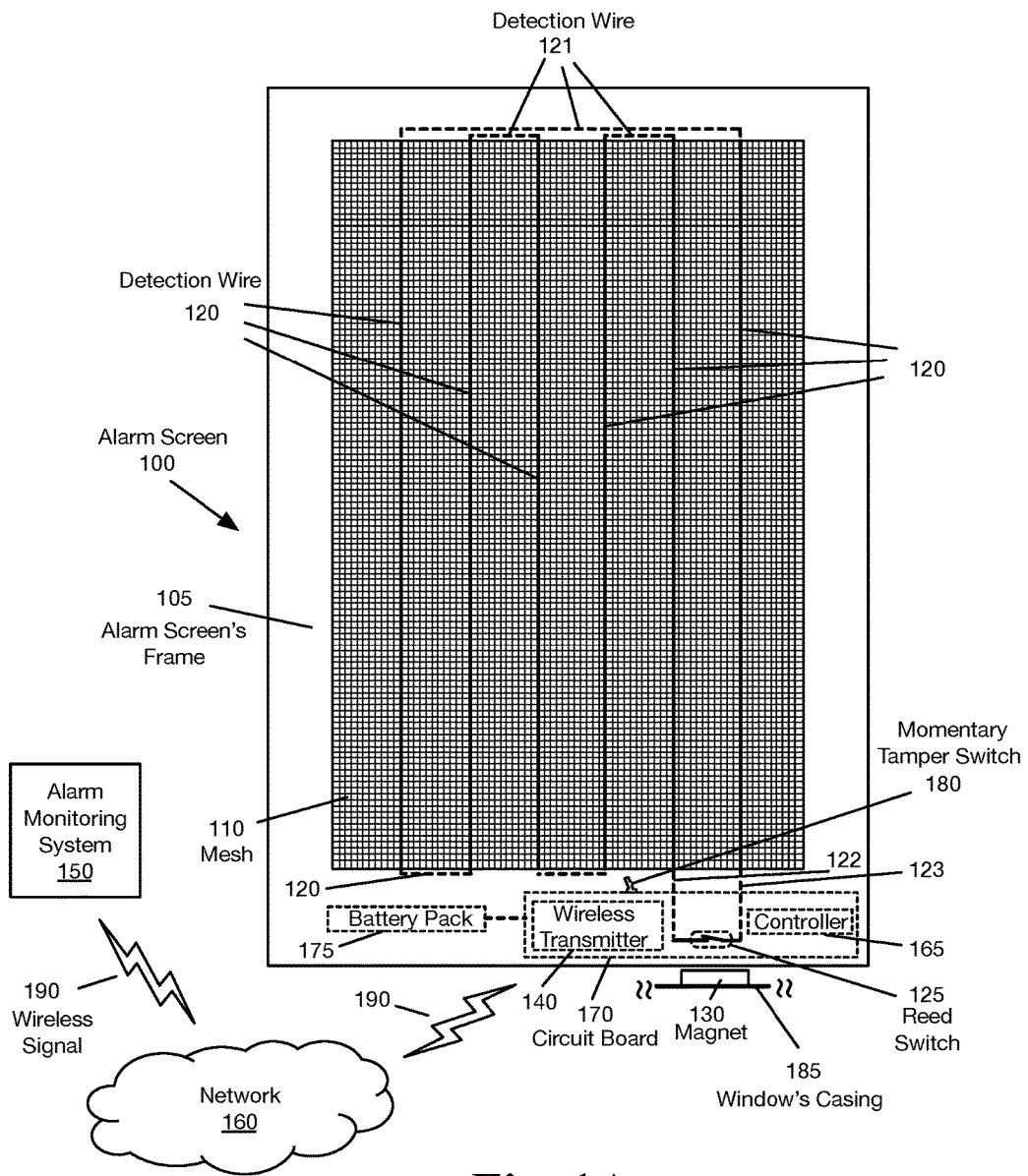
FIG. 1A is a schematic front view of an alarm screen with an embedded wireless transmitter, according to various aspects of the present embodiments.

Entry detection screens, also herein referred to as alarm screens or security screens, are used to secure building openings against intruders. The alarm screens may include a detection wire interwoven within, or overlaid on, the alarm screen's mesh to form a loop for carrying electric current. The alarm screens may include one or more reed switches in proximity of corresponding magnets to detect whether the alarm screen is removed from the casing of a window or door. The alarm screens may detect and may generate one or more signals when the electric current loop is cut open, or the reed switch is removed from the proximity of the corresponding magnet. In wireless alarm systems, the signals are sent to a transmitter that transmits the signal to an alarm panel and/or an alarm system.

One aspect of the present embodiments includes the realization that installing an alarm screen may require additional wiring and/or drilling holes in a door or window frame in order to connect the wires embedded in the alarm screen's mesh to the alarm panel circuit and/or a wireless transmitter, which may be installed on a wall, a window frame, or a door frame outside the alarm screen. Wiring and drilling the holes during the installation of the alarm screen at a premise, require expertise and in some circumstances may invalidate an existing warranty for the window or the door.

Another shortcoming of the alarm screens in past is that, once the alarm screen is assembled and the mesh is attached to the frame, different sides of the frame are locked into each other. In order to access the hollow interior of the frame, one has to either drill a hole in the frame or separate the sides of the frame by force, causing the sides of the frame to separate from each other, the sides of the frame to bend, and/or the mesh to rip apart.

The present embodiments, as described in detail below, solve the above-mentioned shortcomings by embedding one or more electrical components that include a wireless transmitter in a hollow section of the alarm screen's frame. The electrical components detect whether the wiring loop is cut open or the alarm screen is removed from a window or door casing. The electrical components may then generate a signal that may be transmitted by the wireless transmitter to an alarm panel and/or an alarm system. The signal may include a code that indicates an alarm condition including but not limited to the screen being cut or the alarm screen is being removed from a door or window casing.

In some aspects of the present embodiments, the electrical components embedded in the alarm screen may include a processing unit such as a microcontroller. Some of the present embodiments may include one or more reed switches in the same wiring loop as the detection wire (i.e., the reed switch may be in series with detection wire). The processing unit may, through one or more input ports of the processing unit, receive and/or measure one or more parameters (e.g., resistance, impedance, voltage, current, etc.,) of the wiring loop or the reed switch to determine whether the reed switch is no longer in the proximity of the magnet (e.g., when the alarm screen is being removed from the door or window opening) or the wiring loop is cut open (e.g., when an intruder cuts the wiring mesh on the alarm screen to gain access to the premises). The processing unit may then generate a signal that may be transmitted by the wireless transmitter to an alarm panel and/or an alarm monitoring system.

In some of the present embodiments, a momentary tamper switch may be included in the alarm screen. The momentary tamper switch may be attached to a circuit board that includes the electrical components and the wireless transmitter. The momentary tamper switch may be a rocker switch, a toggle switch or a pushbutton, which touches an edge of the alarm screen's frame when the circuit board is embedded in the hollow portion of the frame. The momentary tamper switch may be closed when the tamper switch touches an edge of the alarm screen's frame and may become open when the tamper switch no longer touches the edge of the frame (e.g., when someone attempts to remove the circuit board from the alarm screen). The processing unit may, through one or more input ports of the processing unit, receive and/or measure one or more parameters (e.g., resistance, impedance, voltage, current, etc.,) to determine that the tamper switch is open. The processing unit may then generate a signal that may be transmitted by the wireless transmitter to an alarm panel and/or an alarm monitoring system.

In some of the present embodiments, the alarm screen's frame may have one or more removable corners. The removable corner may have attachments that may snuggly fit into the hollow portion of the frame. For example, the removable corner may have railings on one side to allow the removable corner to be inserted in and removed from the corner of the frame. The removable corner may be removed from the frame without separating the sides of the frame from each other, bending the sides of the frame, and/or ripping the mesh apart. The removable corner may be used to provide easy access to the hollow interior of the frame in order to insert the wireless transmitter inside the frame. The removable corner, in some embodiments, may be attached to a circuit board, or to a housing that surrounds the circuit board. In some of the present embodiments, the wireless transmitter may be inserted in a hollow cavity of the removable corner such that the removable corner and the wireless transmitter may be attached to a corner of the alarm screen's frame as a single unit.

The remaining detailed description describes the present embodiments with reference to the drawings. In the drawings, reference numbers label elements of the present embodiments. These reference numbers are reproduced below in connection with the discussion of the corresponding drawing features.

Some of the present embodiments provide an alarm screen. FIG. 1A is a schematic front view of an alarm screen with an embedded wireless transmitter, according to various aspects of the present embodiments. With reference to FIG. 1A, the alarm screen 100 may include a frame 105 and a mesh 110. The alarm screen's frame may be made of a material such as, without limitations, vinyl, aluminum, aluminum alloy, plastic, wood, etc. The mesh may be made of material such as, without limitations, plastic, vinyl, fiberglass, aluminum, aluminum alloy, and may be used to prevent insects, other animals, debris, etc., out of a building.

In this specification, the term screen's frame refers to a frame that is attached to a mesh such as mesh 110 and may be installed on an opening (such as a window opening or a door opening) of a building. Furthermore, in this specification the terms window/door frame or window/door casing refer to a structure (e.g., framework such as bars and/or railing) that are installed around an opening on a wall in order to support a window or a door. A window/door frame or casing is typically connected to the wall by permanent means such as nails, screws, glue, etc., while an alarm screen's frame is readily removable from the opening that it covers.

With further reference to FIG. 1A, the alarm screen 100 may include one or more strands of detection wire 120, 121, 122, and 123 that form a loop for conducting electric current. In some of the present embodiments, the strands of wire 120-123 may be covered by an insulating material. As shown, some portions of the detection wire may be interwoven within or overlaid on the screen's mesh (as shown by 120). Some portions of the detection wire may pass inside the hollow frame 105 of the alarm screen 100 (as shown by 121-123). Some portions of the detection wire may pass through a channel under the spline as described below with reference to FIG. 5.

The alarm screen 100 may include a wireless transmitter 140, a controller 165, and a battery pack 175 embedded in the hollow portion of the alarm screen's frame 105. The electrical components and the portions of the detection wire that are embedded inside the frame 105 are shown as dashed lines. The wireless transmitter 140 and controller 165 may be included on a circuit board 170. The circuit board 170 may include a reed switch 125 and a momentary tamper switch 180.

The reed switch 125 is an electrical switch that is actuated by a magnetic field. When the reed switch is near a magnet 130, the reed switch closes. The magnet 130 may be a strip of magnet that is installed on a wall, a window or door frame, or a window casing 185 and the circuit board 170 is installed such that the reed switch is close to the magnet 130. When the reed switch is separated from the magnet (e.g., when the frame 105 is removed from the opening that is covered by the alarm screen's frame 105, the reed switch 125 opens).

The controller 165 may then detect that the read switch is open (e.g., by measuring or receiving one or more parameters such as resistance, impedance, voltage, current, etc.,) and may use the wireless transmitter 140 to send a wireless signal 190 through a network 160 to an alarm monitoring system 150 and/or directly to an alarm panel (as described below with reference to FIG. 1B). The alarm monitoring system may include an alarm panel, a hub, a gateway, a router, and/or a bridge within the proximity of the building where the alarm screen 100 is installed. The alarm monitoring system, in some aspects of the present embodiments, may include a remote monitoring system that is used to receive and monitor the alarm signals. The alarm monitoring system, in some aspects of the present embodiments, may include one or more client devices associated with the premises where the alarm screen 100 is installed. Further details of the way that different components of FIG. 1A may communicate are described below with reference to FIG. 2A.

In some of the present embodiments, the reed switch 125 is in series with the detection wire 115-122. In the example of FIG. 1A, the portions 122 and 123 of the detection wire are connected to the two electrical contacts on the reed switch 125. When a portion of the detection wire 120-123 is cut, the electrical loop that includes the reed switch 125 opens. The controller 165 may then detect (e.g., by measuring or receiving one or more parameters such as resistance, impedance, voltage, current, etc.,) that the electrical loop is open and may use the wireless transmitter 140 to send a wireless signal 190 through a network 160 to an alarm system 150 and/or directly to an alarm panel (as described below with reference to FIG. 1B).

Figure 5:
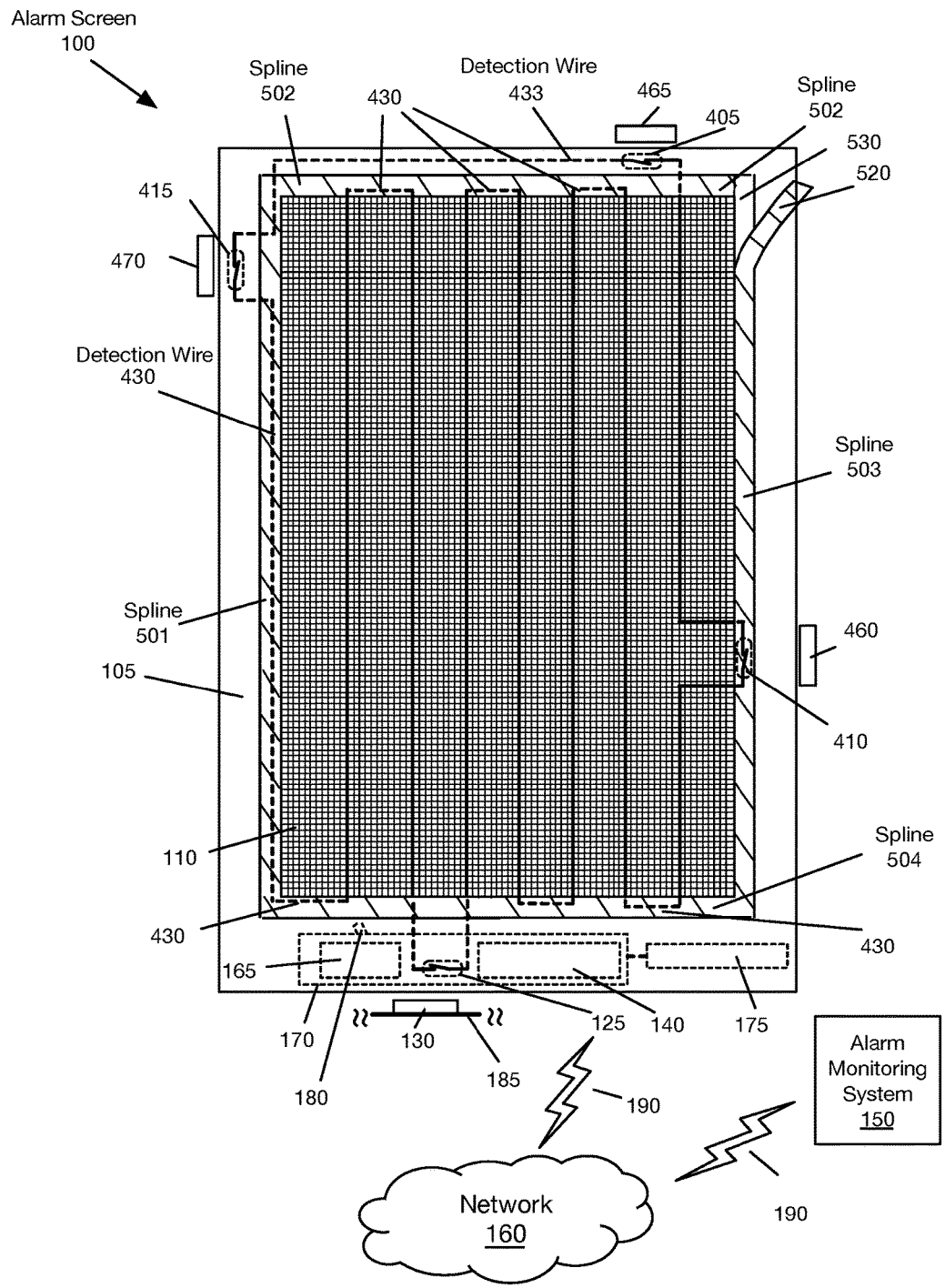
FIG. 5 is a schematic back view of an alarm screen with an embedded wireless transmitter and a spline of insulative material around the alarm screen's mesh, according to various aspects of the present embodiments.

The tamper switch 180 is a normally open momentary switch. The tamper switch 180 is an electrical switch and may be a rocker switch, toggle switch or a push button. When the circuit board 170 is installed inside the frame 105, the tamper switch 180 may touch the interior of the hollow frame as shown in FIG. 5.

The tamper switch 180 closes as long as it touches an object such as the interior of the frame. The tamper switch 180 opens when it no longer touches the object. If someone attempts to remove the circuit board from the alarm screen's frame, the tamper switch would no longer touch the interior of the frame and opens. The controller 165 may then detect that the tamper switch 180 is open and may use the wireless transmitter 140 to send a wireless signal 190 through a network 160 to the alarm system 150 and/or directly to an alarm panel (as described below with reference to FIG. 1B).

The tamper switch 180 may be used as a 24 hour tamper switch such that even when the alarm system is turned off, when the tamper switch 180 opens and the alarm system 150 receives a signal from the wireless transmitter 140 indicating that the tamper switch has opened, the alarm system generates a alarm signal (e.g., sounds an audible alarm and/or sends an alarm signal to a remote alarm monitoring system). The tamper switch 180 may, therefore, be used to prevent a potential intruder to remove the circuit board 170 while the alarm system is off in order to remove the alarm screen 100 and/or to cut the detection wire 120-123 at a later time when the alarm system may be on.

As described above, in some embodiments, three types of tampering with the alarm screen 100 may be detected. The reed switch 125 may open when the alarm screen is removed from the opening, moving the reed switch 125 away from the magnet 130. The electrical loop of the detection wire 120-123 may open when a portion of the detection wire 120-123 is cut. A third type tampering with the alarm screen 100 may be detected by the momentary tamper switch 180 when the circuit board 170 is removed from the alarm screen's frame 105.

Figure 1B:
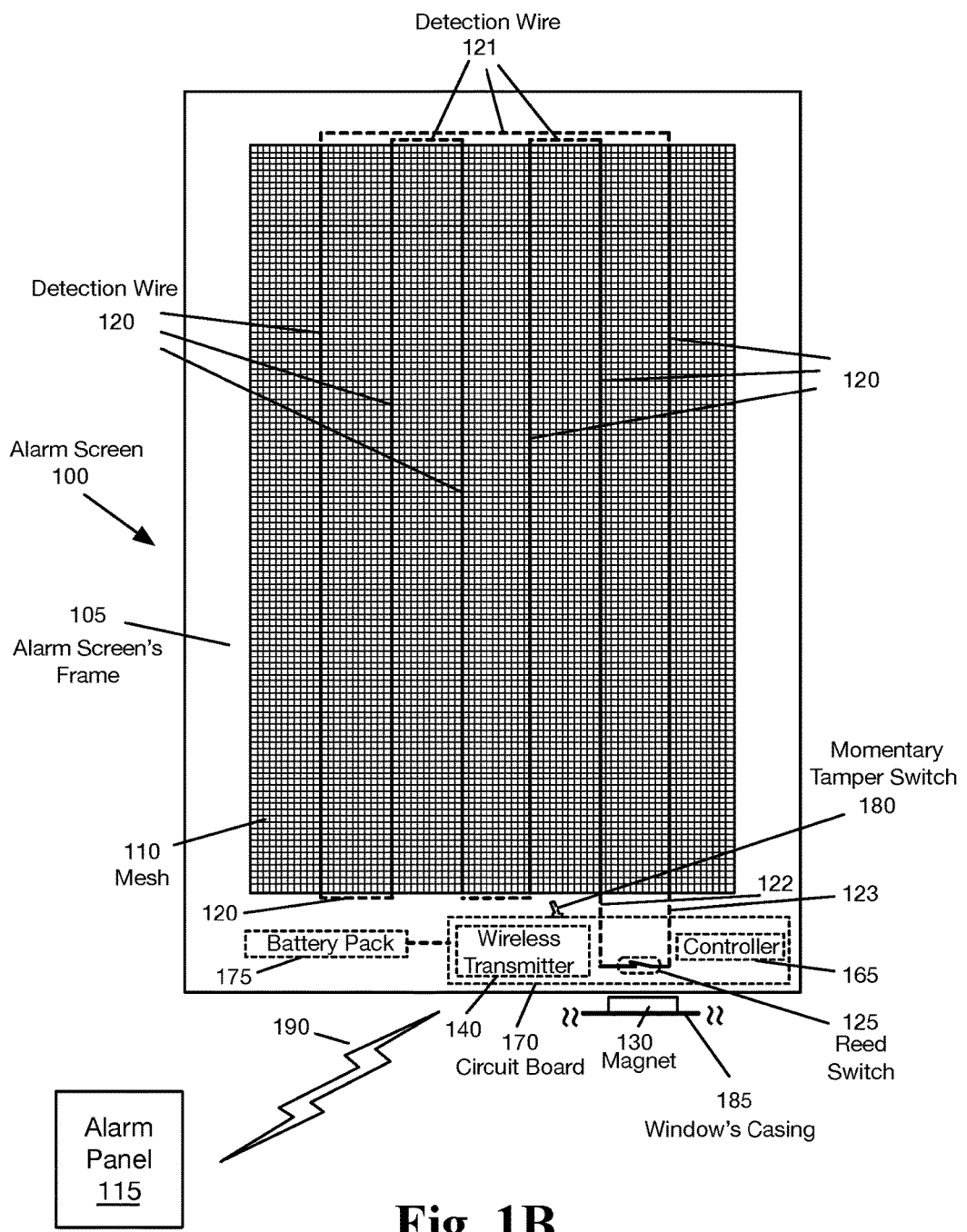
FIG. 1B is a schematic front view of an alarm screen with an embedded wireless transmitter that directly communicates with an alarm panel, according to various aspects of the present embodiments.

FIG. 1B is a schematic front view of an alarm screen with an embedded wireless transmitter that directly communicates with an alarm panel, according to various aspects of the present embodiments. Some alarm companies install an alarm panel 115 in a premise that directly communicates with the contact sensors, motion sensors, and alarm screens of the alarm system. In the example of FIG. 1B, the wireless transmitter 140 directly communicates with alarm panel 115. For example, the wireless transmitter transmits signals using a particular frequency band and the alarm panel receives signals on the same frequency band. Further details of the way that different components of FIG. 1B may communicate are described below with reference to FIG. 2B. Although the circuit board 170 and the battery pack 175 in FIGS. 1A and 1B are shown to be embedded in the bottom portion of the alarm screen's frame, the circuit board 170 and/or the battery pack 175, in different embodiments, may be embedded anywhere in the body of the alarm screen's frame.

Figure 2A:
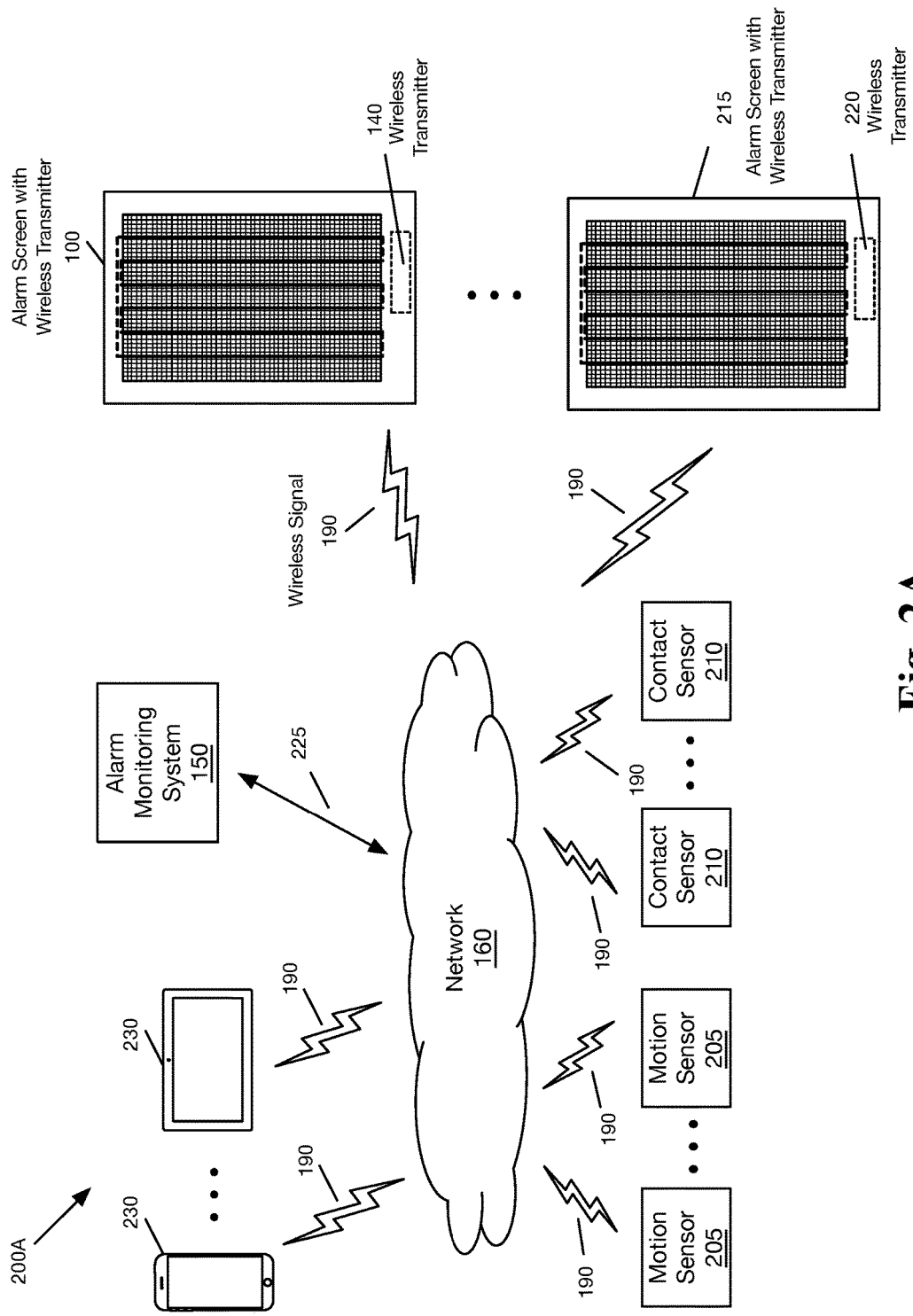
FIGS. 2A and 2B are functional block diagrams illustrating systems for communicating alarm status, according to various aspects of the present disclosure.
Figure 2B:
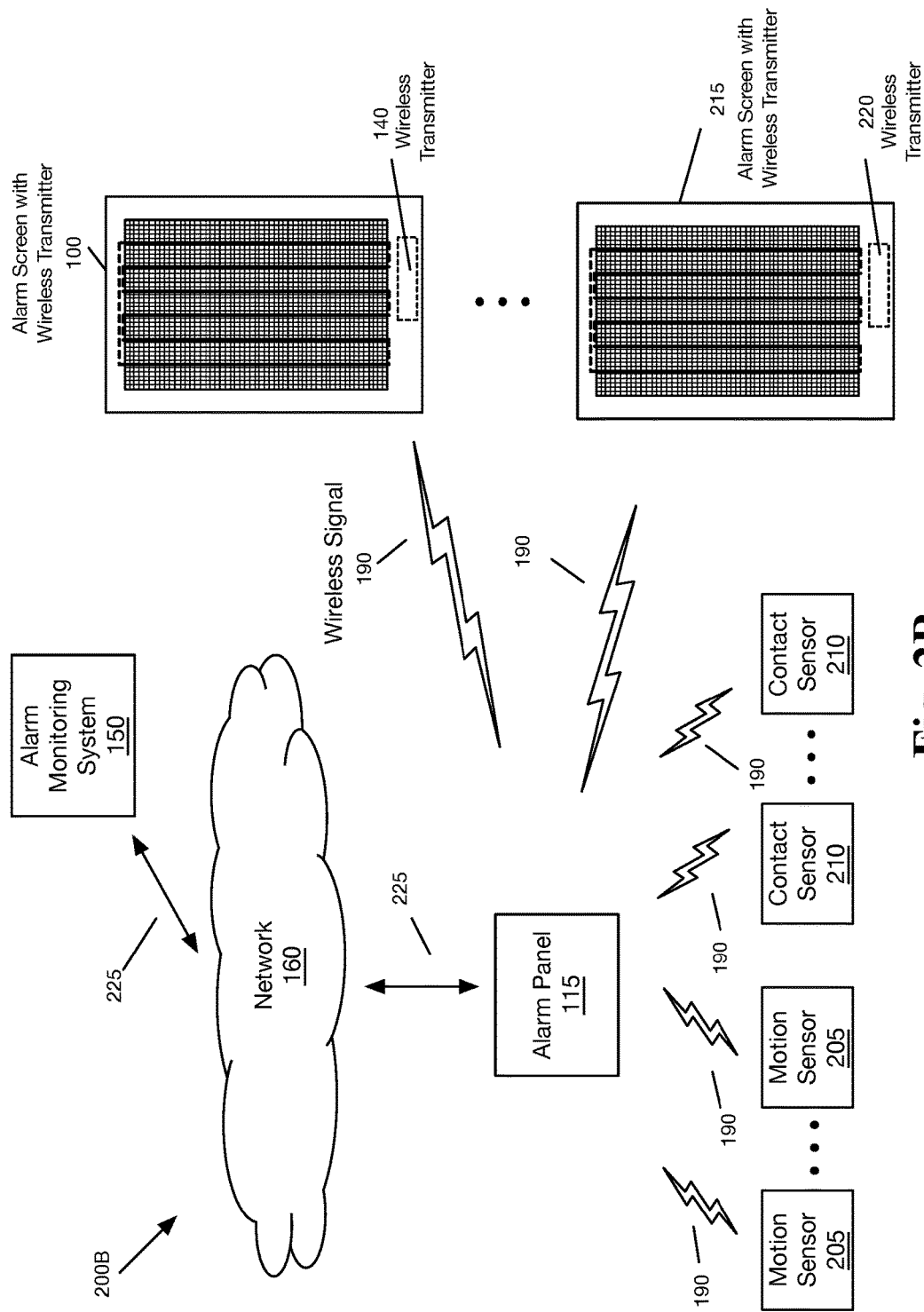

FIGS. 2A and 2B are functional block diagrams illustrating systems for communicating alarm status, according to various aspects of the present disclosure. With reference to FIG. 2A, the alarm system 200A includes one or more motion sensors 205 to detect movements in a premise, one or more contact sensors 210 to determine whether doors or windows in the premises are opened or closed, and one or more alarm screens 100 and 215 such as the alarm screen 100 of FIG. 1A.

With reference to FIG. 2A, the alarm screens 100 and 215 include wireless transmitters 140 and 215 and wirelessly communicate alarm status with the network 160 through the wireless links 190. The motion sensors 205 and the contact sensors 210 may include wireless transmitters (not shown) and may communicate alarm status with the network 160 through the wireless links 190. The alarm system 200A may include one or more client devices 230 associated with the premises where the motion sensors 205, the contact sensors 210, and the alarm screens 100 and 205 are installed. The client devices 230 may run application programs for receiving and displaying the alarm status, turning the alarm system on or off, etc.

The alarm system 200A may include an alarm monitoring system 150 that may be located at a remote location and may communicate the alarm status to the people residing at the premises, to the people at the remote central monitoring station, or to private security guards. The alarm monitoring system may receive alarm status through a communication link 225, which may be a telephone line or a wireless channel (e.g., cellular or other type of wireless channels). The wireless communication with the alarm monitoring system 150 may be made through a hub, a gateway, a router, and/or a bridge associated with the premises.

With reference to FIG. 2B, the alarm screens 100 and 215 include wireless transmitters 140 and 215 and wirelessly communicate alarm status with the alarm panel 115 through wireless links 190. The alarm panel may be installed at the premises by an alarm dealer that controls the alarm monitoring system 150. The motion sensors 205 and the contact sensors 210 may include wireless transmitters (not shown) and may communicate alarm status with the alarm panel 115 through the wireless links 190.

The alarm panel 115 may send alarm status to and communicate with the alarm monitoring system 150 through the network 160 (e.g., the Internet, landline telephone network, cellular network, etc.). The communication channel between the alarm panel 115 and the alarm monitoring system 150 may be wired or wireless. The alarm panel may sound an alarm if the panel receives an alarm status from the motion sensors 205, contact sensors 210, or alarm screens 100 and 215 depending on the status of the alarm system. For example, an alarm may sound if the alarm system is on and an alarm status is received from one of the motion sensors 205, contact sensors 210, or alarm screens 100 and 215. In some aspects of the present embodiments, an alarm may sound if the tamper switch 180 of FIG. 1B sends an alarm signal when the alarm system is off. In some aspects of the present embodiments, an alarm may not sound if the tamper switch 180 of FIG. 1B (or any other components 205, 210, 215, 100 of the alarm system 200B) sends an alarm signal when the alarm system is placed in configuration mode.

Although the alarm screens 100 and 215 in FIGS. 2A, and 2B are shown to include a wireless transmitter 140, 220, in some of the present embodiments, the alarm screens may include a transceiver that is capable of both transmitting and receiving signals. In these embodiments, the alarm screen's transceiver may receive signals from the alarm monitoring system 150 and/or the alarm panel 115, for example, to download new software or firmware into the controller 165, to provide the voltage level of the battery pack, to reset the controller, etc. It should, therefore, be understood that the wireless transmitters in any of the disclosed alarm screens herein may be replaced by a transceiver that includes both a transmitter and receiver.

Figure 3A:
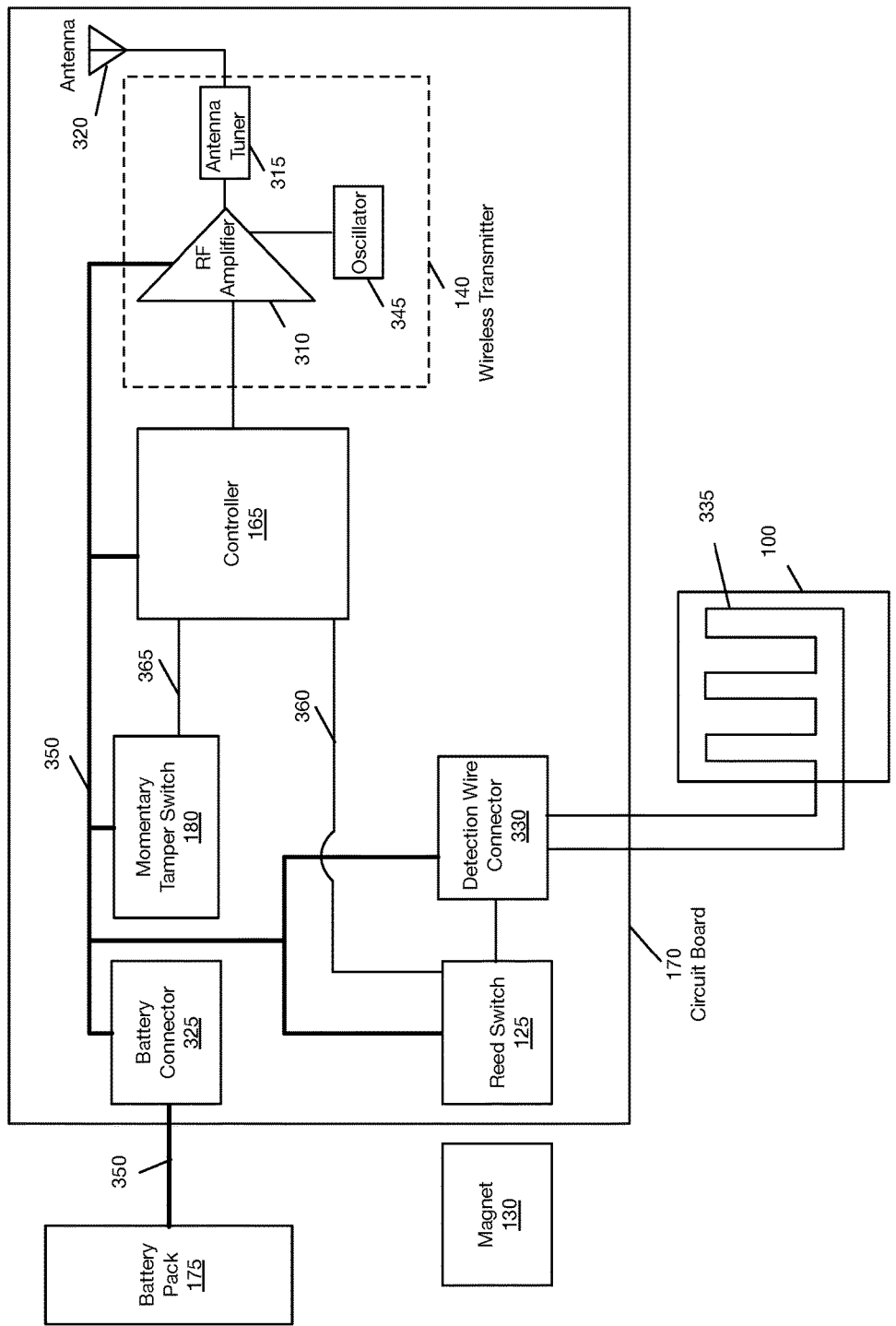
FIGS. 3A-3D are functional block diagrams illustrating example of the electrical components that may be used in alarm screens, according to various aspects of the present disclosure.

FIGS. 3A-3D are functional block diagrams illustrating example of alarm components that may be used in alarm screens, according to various aspects of the present disclosure. With reference to FIG. 3A, the alarm components may include a battery pack 175, a battery connector 325, a momentary tamper switch 180, a controller 165, a radio frequency (RF) amplifier 310, an oscillator 345, an antenna tuner 315, an antenna 320, a reed switch 125, a detection wire connector 330, a magnet 130, and a detection wire 335 that is interwoven within or overlaid on the alarm screen 100.

The battery pack 175 may include one or more batteries and may provide a positive battery line and a negative battery line to the battery connector 325. The figure shows only one line 350 between the battery pack 175, the battery connector 325, and the other alarm components for simplicity. The battery pack 175 may include one or more batteries.

In some of the present embodiments, the battery pack 175 may include several batteries that are connected to each in parallel such that the resulting voltage is similar to the voltage of the individual batteries and the current provided by the battery pack may be the sum of the currents provided by each battery. As an example, and without any limitations, a pack of 8 three volts, 50 mA lithium ion batteries that are connected in parallel may provide three volts and 400 mA of current.

In some of the present embodiments, the battery pack 175 may include several batteries that are connected to each in series such that the resulting current is similar to the current generated by the individual batteries and the voltage provided by the battery pack may be the sum of the voltages provided by each battery. In some of the present embodiments, the battery pack 175 may include several groups of batteries where each group of batteries is connected to each other in parallel and the groups are connected to each other in series.

With further reference to FIG. 3A, in the embodiments that use a circuit board 170, the battery connector 325 may be, without any limitations, a wire-to-board 2-pin connector. For example, when the battery wires are 28 American wire gauge (AWG), the battery connector 325 may be a 28 AWG wire-to-board 2-pin connector.

The controller 165 may be, without any limitations, a processing unit such as a microcontroller unit (MCU), a microprocessor, an application specific integrated circuit (ASIC) or a field programmable gate array (FPGA). The controller 305 may include memory to store instructions that are executable by the controller 165. In some of the present embodiments, the controller 165 may be a low power MCU (e.g., without any limitations, an 8-bit 20 MHz MCU) that is capable of very low power standby operation.

The momentary tamper switch 180 may be, without any limitations, a normally open switch such as a momentary rocker switch, a momentary toggle switch, or a momentary push button switch. The reed switch 125 may be a normally open reed switch. The reed switch 125 closes when in vicinity of a magnet such as the magnet 130. The magnet 130 may be installed on a wall, a door/window frame, or a door/window casing, and the circuit board 170 may be embedded inside the alarm screen's frame such that the reed switch is close enough to the magnet 130 to close the reed switch 125.

The reed switch 125 may open when the alarm screen 100 is removed from the opening that is covered by the alarm screen, moving the reed switch 125 away from the magnet 130. The reed switch 125 in FIG. 3A may be in series with the detection wire 335 through the detection wire connector 330. The detection wire connector 330 may be, without any limitations, a terminal block connector. When a portion of the detection wire 335 is cut, the current no longer passes through the detection wire 335 and the reed switch 125.

With further reference to FIG. 3A, the wireless transmitter 140 may include, as an example and without any limitations, an RF amplifier 310, an oscillator 345, and an antenna tuner (or matching network) 315. The oscillator 345 may generate the radio frequency signal. The RF amplifier may increase the power of the signal received from the controller 165. The antenna tuner 315 may improve power transfer between the RF amplifier 310 and the antenna 320 by matching the impedance of the antenna to a specified impedance (e.g., without any limitations to 50 Ohms). The antenna may be, without any limitations, a loop antenna, a dipole antenna, a monopole antenna, etc. The wireless transmitter 140 and the antenna 320 may transmit radio frequency signals in licensed and unlicensed frequency bands such as, for example and without any limitations, WiFi, Bluetooth, cellular, etc.

The controller 165 may receive one or more inputs from the reed switch 125 and/or from the electrical loop that goes through the detection wire 335 and the reed switch 125 (e.g., as shown by the input line(s) 360) and from the momentary tamper switch 180 (e.g., as shown by the input line(s) 365). The controller 165 may measure or receive one or more parameters such as, for example, resistance, impedance, voltage current, etc., on the input line(s) 360 to determine whether the reed switch 125 is open or closed or whether the electrical loop that goes through the detection wire 335 and the reed switch 125 is open. The controller 165 may measure or receive one or more parameters such as, for example, resistance, impedance, voltage current, etc., on the input line(s) 365 to determine whether the momentary tamper switch 180 is opened or closed.

The controller 165 may send one or more signals to the wireless transmitter 140 to identify the status detected from different components of the alarm system. In some embodiments, the controller may send different status codes to the wireless transmitter 140 to indicate different alarm or health condition of the alarm system. For example, the controller 165 may send a status code to the wireless transmitter 140 to indicate that the reed switch 125 is open (e.g., when the alarm screen 100 is removed from the corresponding door or window opening) or the electrical loop that goes through the detection wire 335 and the reed switch 125 is cut.

The controller 165 may send a status code to the wireless transmitter 140 to indicate a change in the status of the momentary tamper switch 180 when the momentary tamper switch 180 changes from close to open and/or from open to close. For example, the controller 165 may send a status code to the wireless transmitter 140 to indicate that the status of the momentary tamper switch 180 is changed from closed to opened (e.g., when the wireless transmitter 140 and/or the circuit board 170 are removed from the alarm screen 100). The controller 165 may send a status code to the wireless transmitter 140 to indicate that the status of the momentary tamper switch 180 is changed from opened to closed (e.g., when the wireless transmitter 140 and/or the circuit board 170 are being installed in the alarm screen 100 in order to help an installer to know that the momentary tamper switch 180 has touched the interior of the alarm screen's frame). The controller 165 may measure the voltage level provided by the battery pack 175 and may send a status code to the wireless transmitter 140 to indicate a low battery condition. The controller 165, in some embodiments, may periodically (e.g., every hour, once every several hours, or once every fraction of an hour) a check-in (or keep alive) signal to the wireless transmitter to indicate the alarm components in the alarm screen 100 are still operational. The wireless transmitter 140 may receive the status codes from the controller 165 and may transmit the status codes as an RF signal to the network 160 of FIG. 2A or the alarm panel 115 of FIG. 2B.

The alarm components for the alarm screen may be small enough and may be packaged such that they fit inside the hollow portion of the alarm screen's frame 105 (FIGS. 1A-1B). The battery pack 175, in some embodiments, may be packed separately from the other alarm components. For example, without any limitations, the battery pack 175 may be placed inside a moisture resistant housing with appropriate dimensions to fit inside the frame of different size alarm screen frames.

Some of the alarm components of in FIG. 3A such as the battery connector 325, the momentary tamper switch 180, the controller 165, the radio frequency (RF) amplifier 310, the oscillator 345, the antenna tuner 315, the antenna 320, the reed switch 125, and the detection wire connector 330 may be placed on a circuit board 170. The circuit board 170, in some embodiments, may be a printed circuit board (PCB) to mechanically support and electrically connect the different alarm components. The circuit board 170, in some embodiments, may be sprayed with a coating to protect the circuit board 170 from moisture. The spray may be, without any limitations, a conformal coating material that is a thin polymeric film, which conforms to the contours of a circuit board and protects the board's components.

In some embodiments, a potting process may be used to fill the circuit board 170 with a solid or gelatinous compound to protect the components from moisture and corrosive agents. In some embodiments, the circuit board 170 may be sprayed with a material such as acrylic or a silicon-based substance to provide moisture protection.

In some of the present embodiments, the circuit board may be placed inside a protective enclosure or housing (e.g., without any limitations made at least partially from plastic or epoxy) to provide ease of transportation, ease of installation, and protection from moisture. Examples of different enclosures/housings for the printed circuit board 170 are described below with reference to FIGS. 9 and 12A.

Figure 3B:
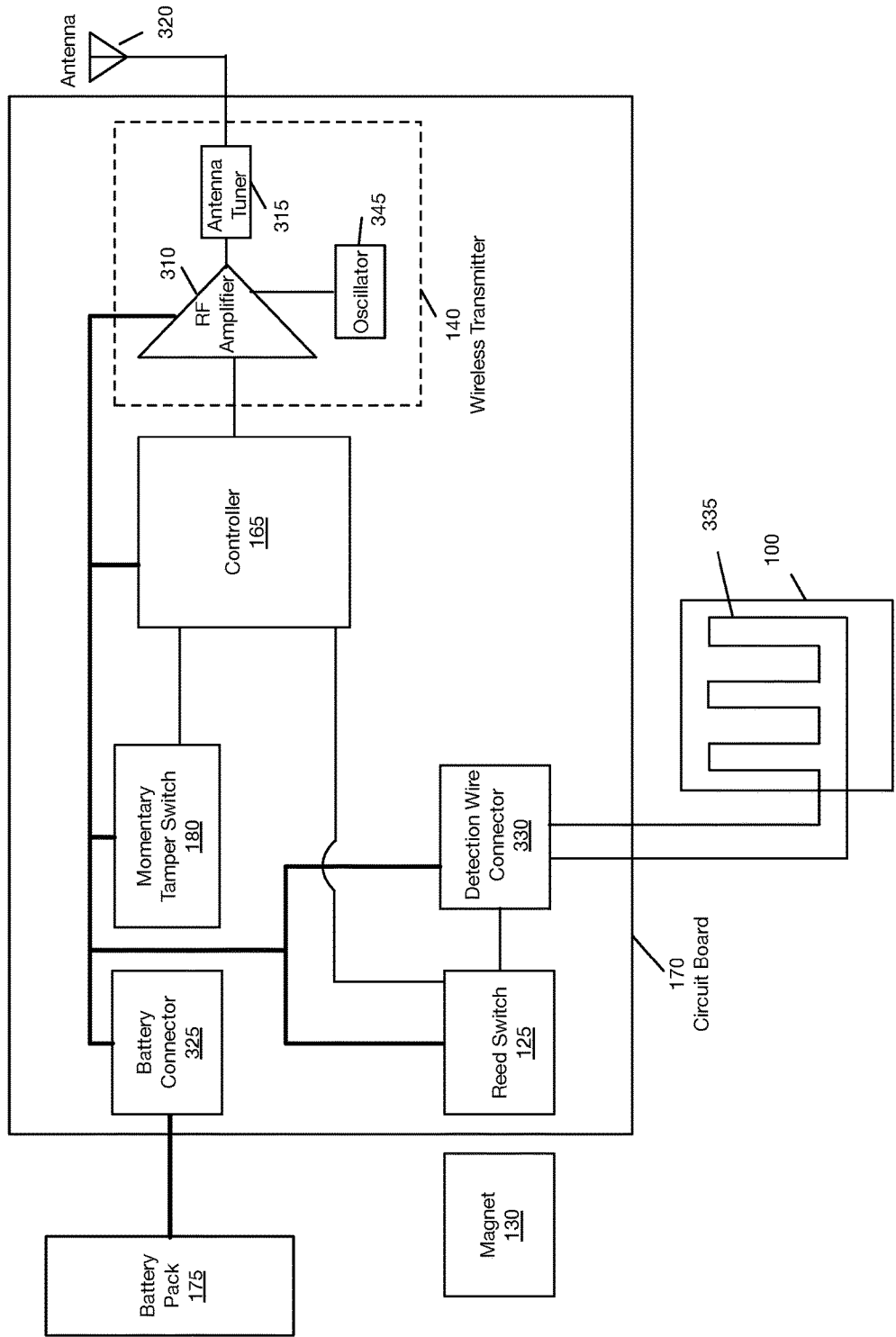
Figure 3C:
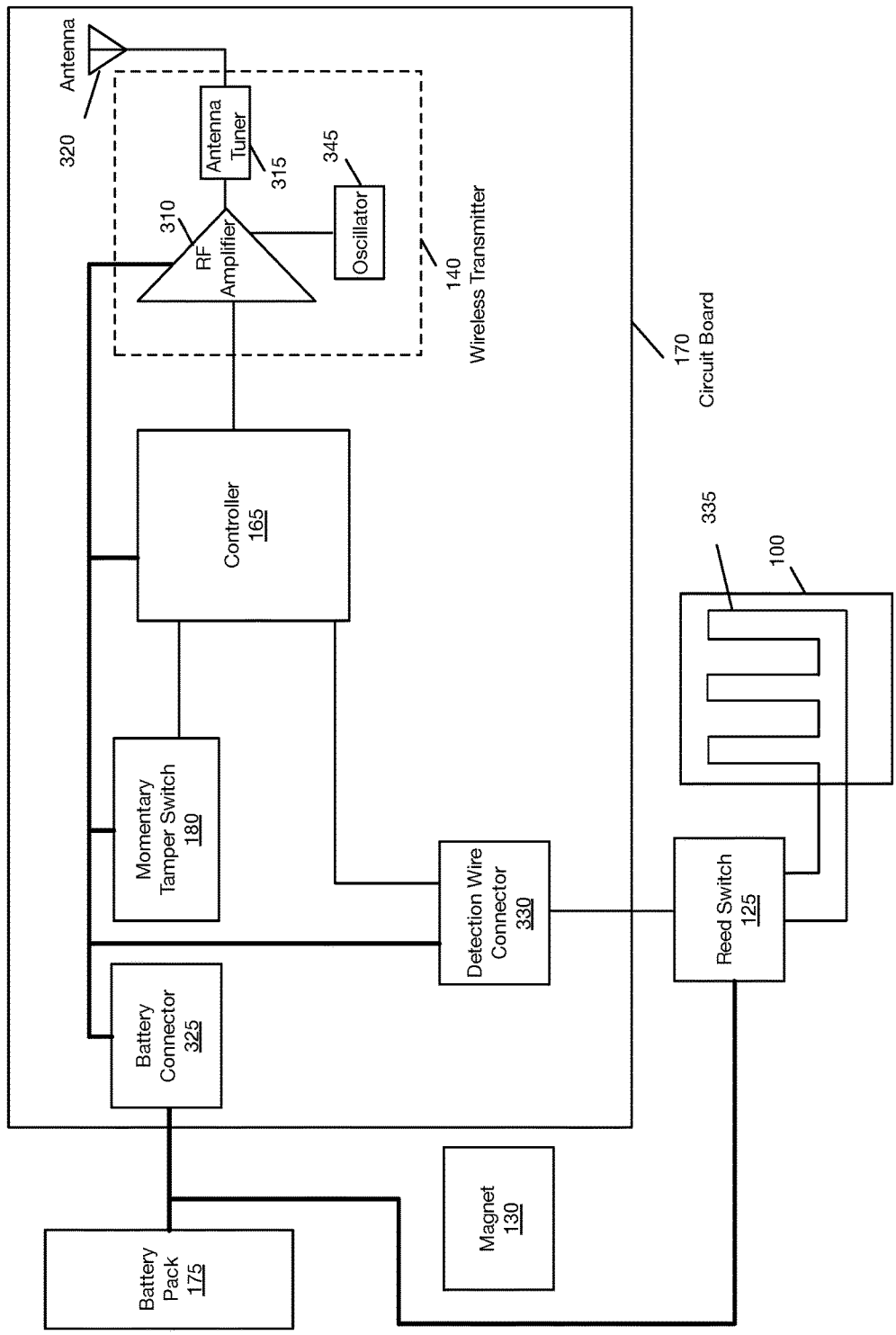
Figure 3D:
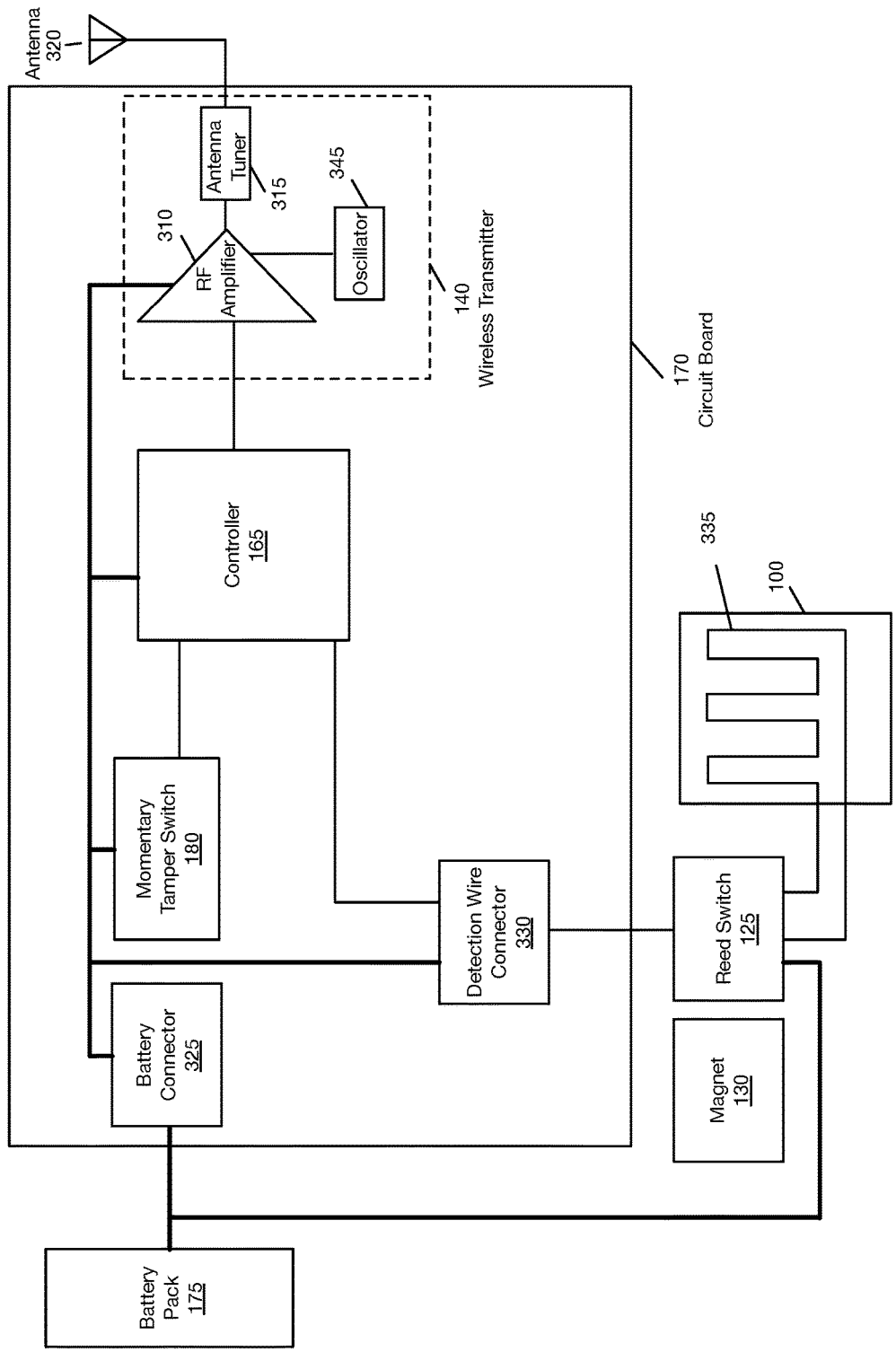

In the embodiment of FIG. 3A, both the antenna 320 and the reed switch 170 are on the circuit board. In other embodiments, the antenna 320, the reed switch 170, or both may be outside the circuit board 170 to make the circuit board 170 smaller and allow the antenna and/or the reed switch to be placed in other placed within the alarm screen 100 than the circuit board 170. FIG. 3B illustrates an example embodiment where the antenna 320 is outside the circuit board 170 and the reed switch 125 is on the circuit board 170. FIG. 3C illustrates an example embodiment where the antenna 320 is inside the circuit board 170 and the reed switch 125 is outside the circuit board 170. FIG. 3D illustrates an example embodiment where both the antenna 320 and the reed switch 125 are outside the circuit board 170. Several examples of these embodiments are described below with reference to FIGS. 4-8, 14, and 16.

Although the controller 165 and the wireless transmitter 140 are shown as separate components in FIGS. 3A-3D, in some embodiments, the controller 165 and the wireless transmitter 140 may be on the same chip. For example, and without any limitations, some embodiments may use a "system on a chip" (SoC) microcontroller with integrated wireless connectivity (e.g., WiFi and/or Bluetooth). Such a "system on a chip" may be provide the functionalities of both the controller 165 and the wireless transmitter 140 (i.e., processing functionalities as well as wireless connectivity functionalities). The "system on a chip" may also include one or more antennas. Some embodiments may use microelectromechanical systems (MEMS) technology and/or nanotechnology to minimize the size of the components of FIGS. 3A-3D in order to better fit the components in small areas within a window/door frame and/or in a cavity in a removable corner of the frame as discussed below with reference to FIGS. 14-16.

Figure 4:
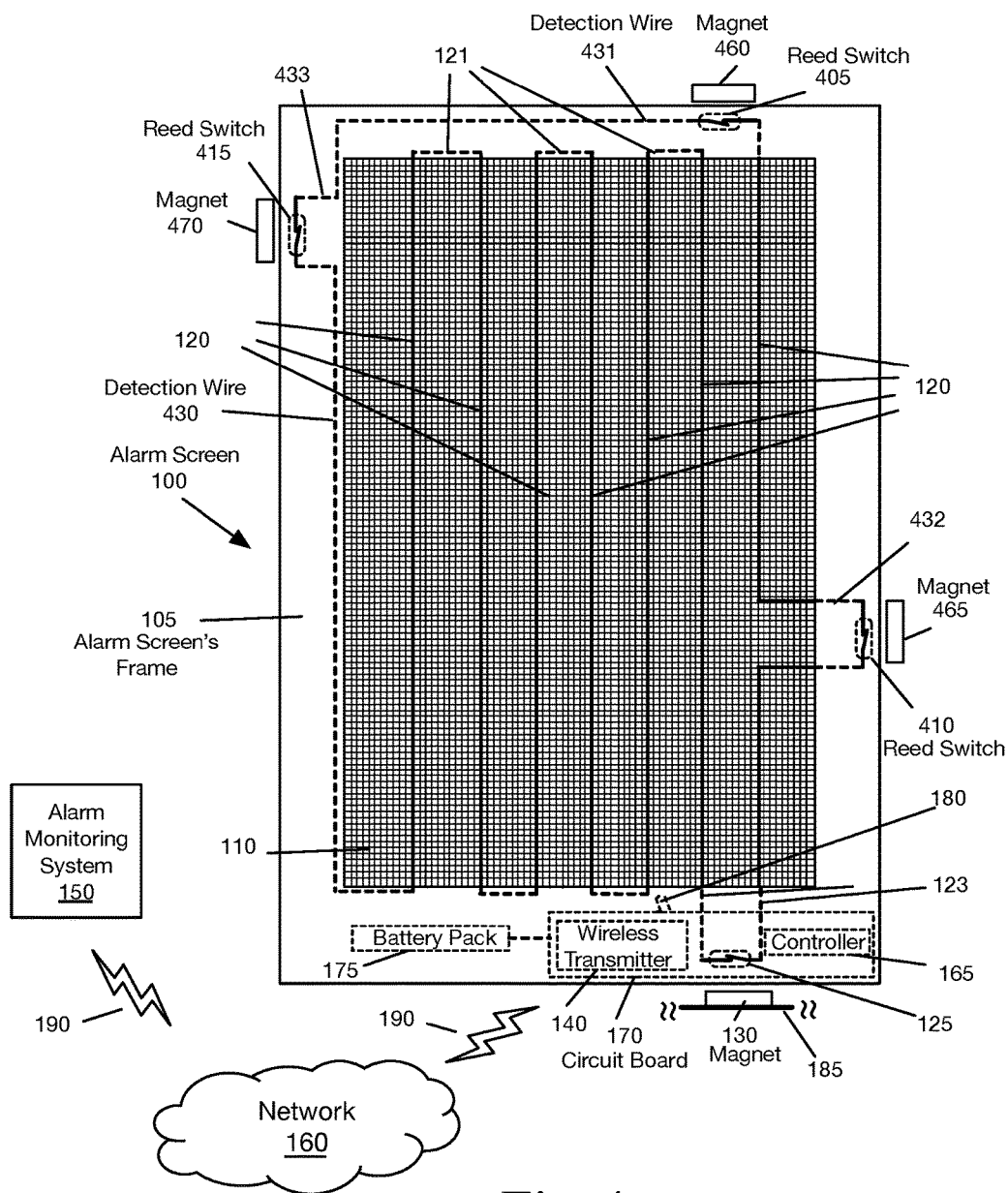
FIG. 4 is a schematic front view of an alarm screen with an embedded wireless transmitter and one or more reed switches, according to various aspects of the present embodiments.

FIG. 4 is a schematic front view of an alarm screen with an embedded wireless transmitter and one or more reed switches, according to various aspects of the present embodiments. Although FIG. 4 and several other figures show the wireless transmitter 140 communicating with the alarm monitoring system 150 through the network 160 (e.g., as described above with reference to FIGS. 1A and 2A), the invention is equally applicable to the embodiments that the wireless transmitter 140 communicates with an alarm panel 115 (e.g., as described above with reference to FIGS. 1B and 2B).

With reference to FIG. 4, one or more reed switches 405-415 that are outside the circuit board 170 are embedded inside the alarm screen's frame 105. The one or more reed switches 405-415 are in series with the detection wire and may be in addition to, or in lieu of a reed switch 125 located on the circuit board 170. Each reed switch may be in a hermetically sealed housing. The reed switches that are outside the circuit board may provide an extra protection when the alarm screen is large enough such that an intruder may only open a portion of the alarm screen 100 and gain access to the inside of the premises without removing the whole alarm screen 100.

As shown in FIG. 4, each reed switch 405-415 is installed in the proximity of a corresponding magnet 460-470 to protect different sections of the alarm screen 100. Some or all of the reed switches may be installed under the spline. In the example of FIG. 5, the reed switch 410 is installed under the spline 503. Depending on the location of each reed switch 405-415, a portion of the detection wire may be connected to the reed switch. When each one of the reed switches 405-415 is separated from the corresponding magnet 460-470, the reed switch opens, causing the detection wire loop to open. The controller 165 may then generate a status signal to indicate that the alarm screen 100 is being tampered with.

FIG. 5 is a schematic back view of an alarm screen with an embedded wireless transmitter and a spline of insulative material around the alarm screen's mesh, according to various aspects of the present embodiments. With reference to FIG. 5, the alarm screen includes a spline of insulative material around the board of the alarm screen's mesh 110. The spline, in some embodiments may include several segments 501-504. The spline may be made of a material such as, without any limitations, rubber, resin, or silicon.

Some embodiments may include a groove or channel 530 around the interior edges of the frame 105. The edges of the mesh 110 are held to the alarm screen's frame 100 by placing the edges of the mesh into the channel and forcing the segments 501-504 of the expandable spline 505 into the corresponding segments of the groove to hold the mesh 110 attached to the frame 100. In FIG. 5, a portion 520 of the spline segment 503 is removed to show the position of the channel 530 under the spline 503.

The spline 505 may be used to hold and/or hide a portion 430 of the detection wire that are not interwoven within or overlaid on the mesh 110. In some embodiments, some portion 433 of the detection wire that are not interwoven throughout the mesh 110 may run within the hollow portion of the alarm screen's frame 105.

Figure 6:
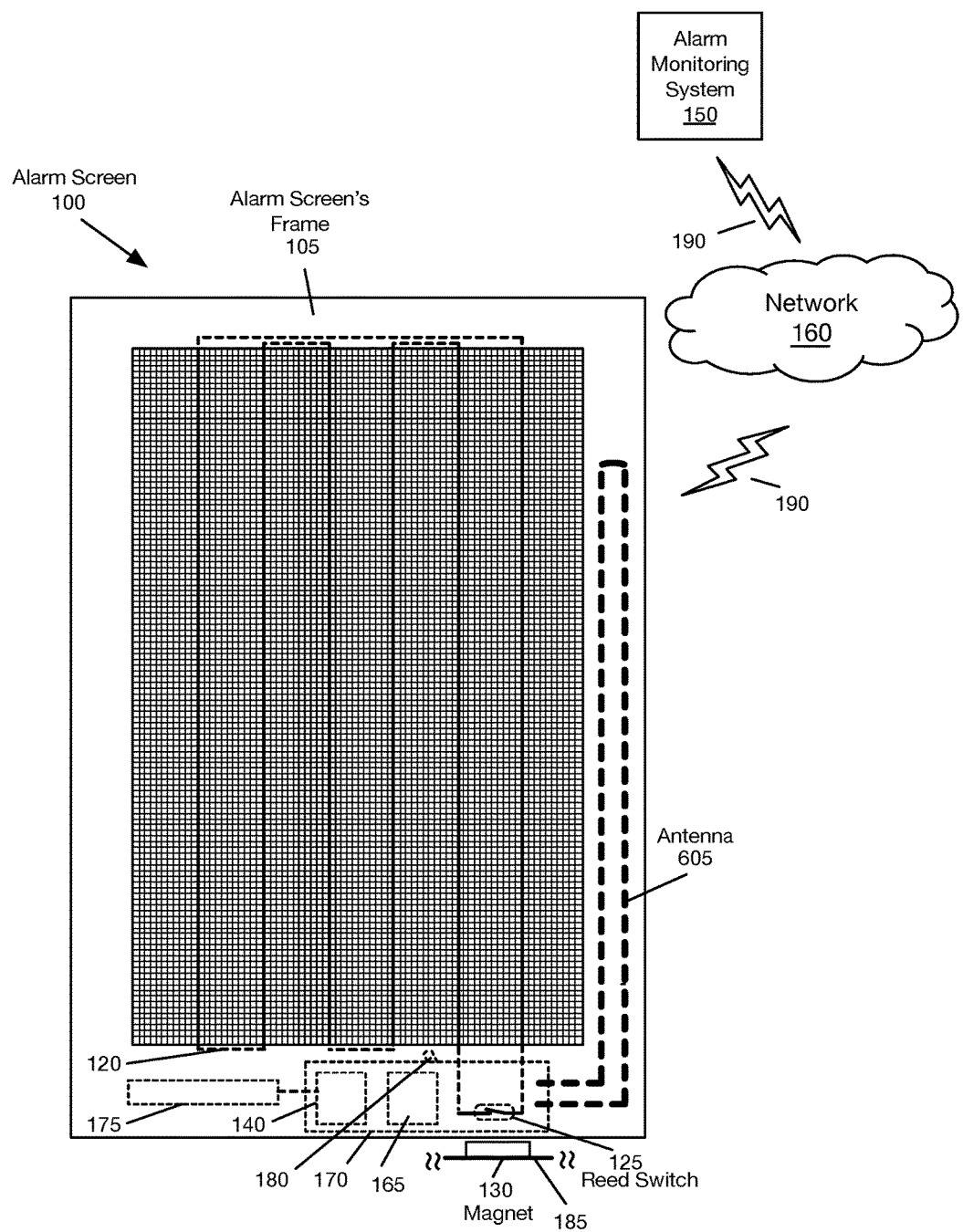
FIG. 6 is a schematic front view of an alarm screen with an embedded wireless transmitter and an antenna that is placed outside the circuit board within a hollow portion of the alarm screen's frame, according to various aspects of the present embodiments.

FIG. 6 is a schematic front view of an alarm screen with an embedded wireless transmitter and an antenna that is placed outside the circuit board within a hollow portion of the alarm screen's frame, according to various aspects of the present embodiments. With reference to FIG. 6, the antenna 605 is placed within the hollow portion of the alarm screen's frame 105 outside the circuit board 170. The embodiment of FIG. 6 provides the advantage that the circuit board 170 without an antenna inside the circuit board may be smaller and easier to fit inside the alarm screen's frame 105.

Figure 7:
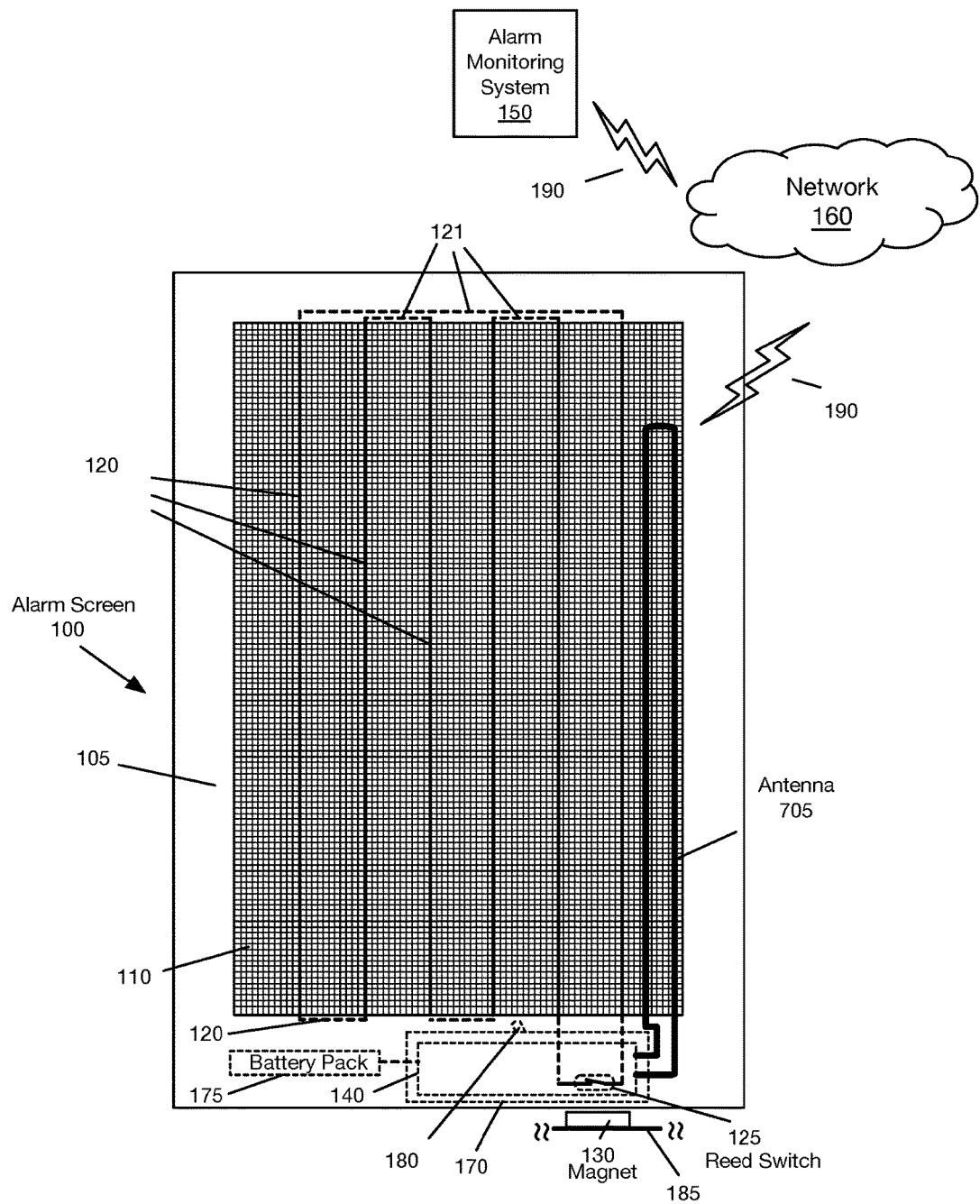
FIG. 7 is a schematic front view of an alarm screen with an embedded wireless transmitter and antenna that is interwoven within or overlaid on the alarm screen's mesh, according to various aspects of the present embodiments.

FIG. 7 is a schematic front view of an alarm screen with an embedded wireless transmitter and antenna that is interwoven or overlaid on the alarm screen's mesh, according to various aspects of the present embodiments. With reference to FIG. 7, the antenna 705 is interwoven or overlaid on the alarm screen's mesh 110. The embodiment of FIG. 7 provides the advantage that the circuit board 170 without an antenna inside the circuit board may be smaller and easier to fit inside the alarm screen's frame 105. Additionally, the antenna 705 is placed outside of the frame 105 and may be able to better communicate with the network 160 or the alarm panel 115 (FIG. 1B).

Figure 8:
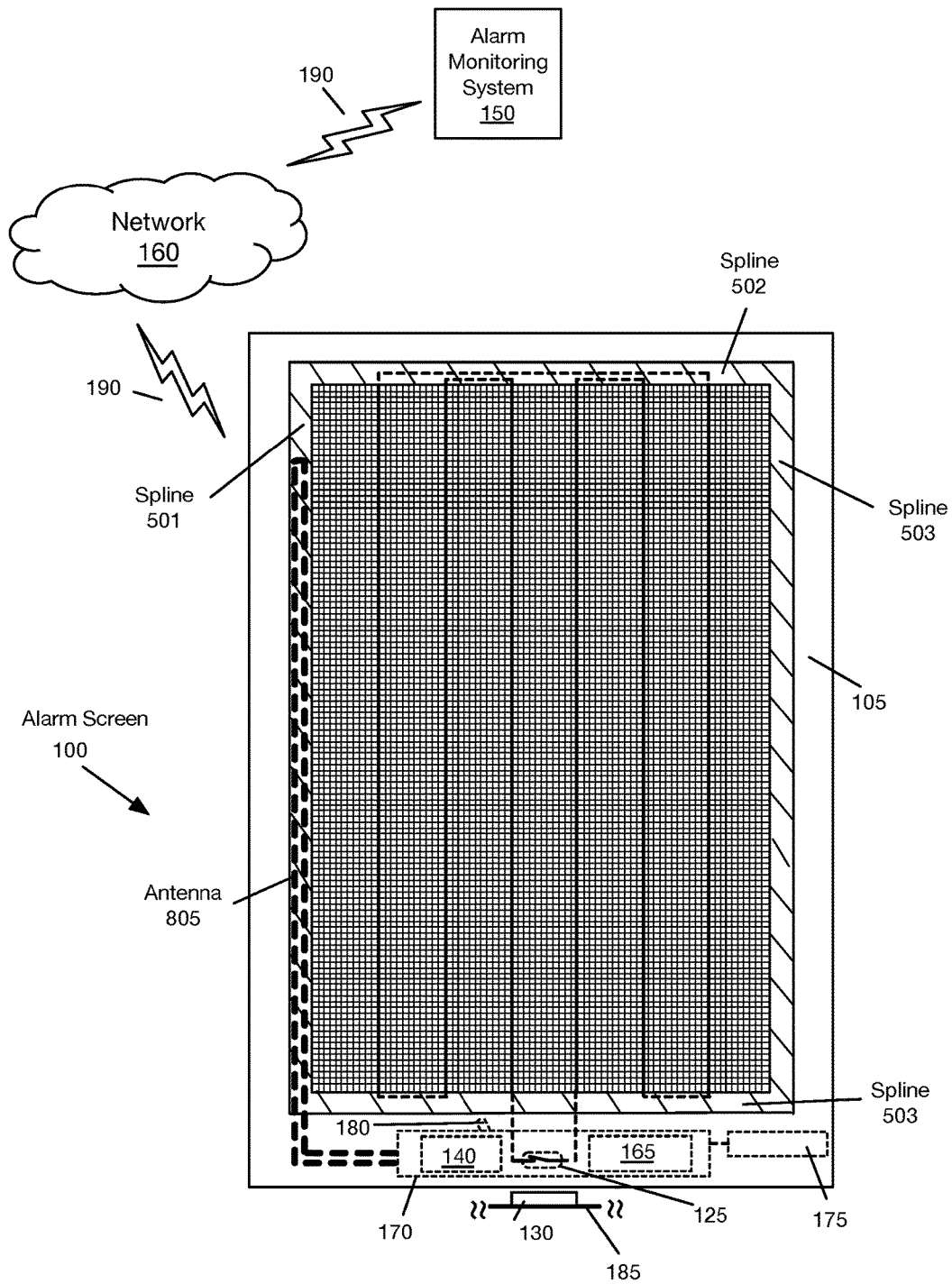
FIG. 8 is a schematic back view of an alarm screen with an embedded wireless transmitter and antenna that is placed under the spline, according to various aspects of the present embodiments.

FIG. 8 is a schematic back view of an alarm screen with an embedded wireless transmitter and antenna that is placed under the spline, according to various aspects of the present embodiments. With reference to FIG. 8, the antenna 805 is placed in the channel (not shown) around the outside perimeter of the alarm screen's frame 100 and the spline segment 501 is pressed over the antenna and into the channel. The embodiment of FIG. 8 provides the advantage that the circuit board 170 without an antenna inside the circuit board may be smaller and easier to fit inside the alarm screen's frame 105. Additionally, may be easy to install the antenna 805 under the spline 505.

Figure 9:
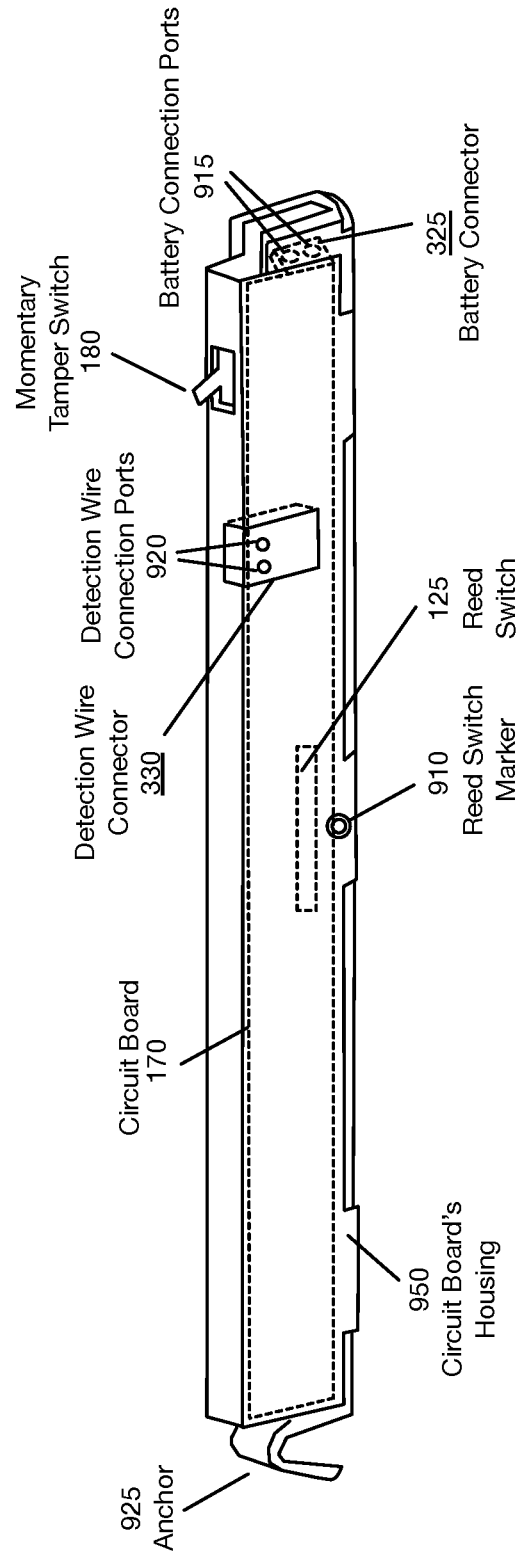
FIG. 9 is a perspective view of a housing for a circuit board that may be embedded in an alarm screen's frame, according to various aspects of the present embodiments.

FIG. 9 is a perspective view of a housing for a circuit board that may be embedded in an alarm screen's frame, according to various aspects of the present embodiments. With reference to FIG. 9, the circuit board's housing 950 provides a protective cover for the circuit board 170, preventing moisture and debris to get on the circuit board. The housing 950 makes it easier to transport, handle, and install the circuit board in the alarm screen's frame 100 (FIGS. 1A-1B).

With further reference to FIG. 9, the housing 950 may include a detection wire connector 330 with ports 920 for connecting the detection wire to the circuit board 170. The housing 950 may include a detection wire connector 325 with ports 920 for connecting the detection wire to the circuit board 170. The housing 950 may include a normally open momentary tamper switch 180. The momentary tamper switch 180 may be a momentary rocker switch, a momentary toggle switch, or a momentary push button.

In some of the present embodiments, the housing 950 may include a marker 910 to identify the approximate location of the reed switch 125 inside the housing 950. The marker 910 may be used to install the housing 950 inside the alarm screen's frame and the magnet 130 on a wall, door/window frame, or door/window casing such that the reed switch and the magnet are located in proximity of each other. Further detail of adjusting the locations of the reed switch and the magnet are described below with reference to FIGS. 10B and 13B.

In some of the present embodiments, the housing 950 may include one or more anchors 925 (only one shown in FIG. 9). The anchor(s) may be used to fix the housing inside the alarm screen's frame. The use of the anchor(s) to fix the housing inside the alarm screen's frame is further described below with reference to FIGS. 10B and 17B. Although several examples are given in this specification where the circuit board may be inside a housing, it should be understood that the circuit board may be imbedded inside an alarm screen's frame without a housing.

Figure 10A:
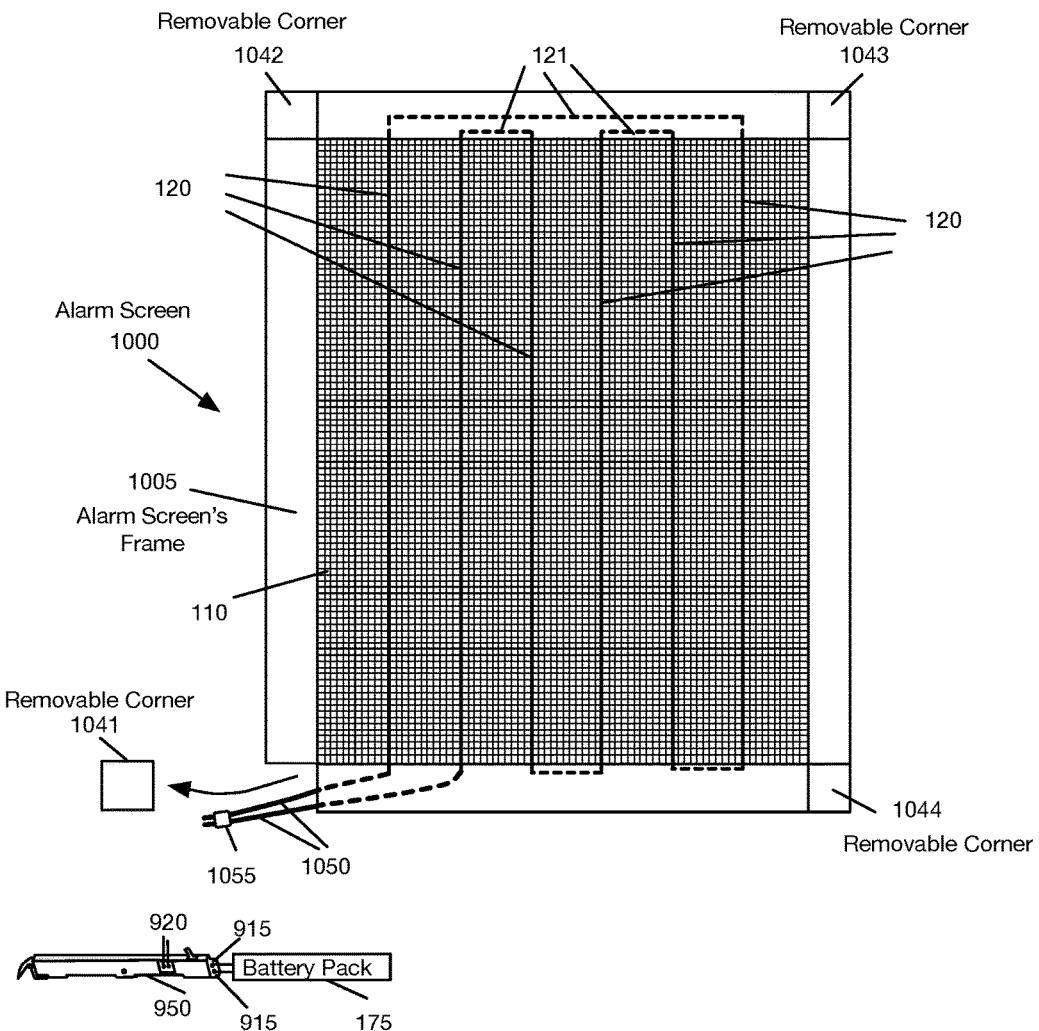
FIGS. 10A-10B are schematic front views of an alarm screen with one or more removable frame corners for embedding a wireless transmitter inside the frame, according to various aspects of the present embodiments.
Figure 10B:
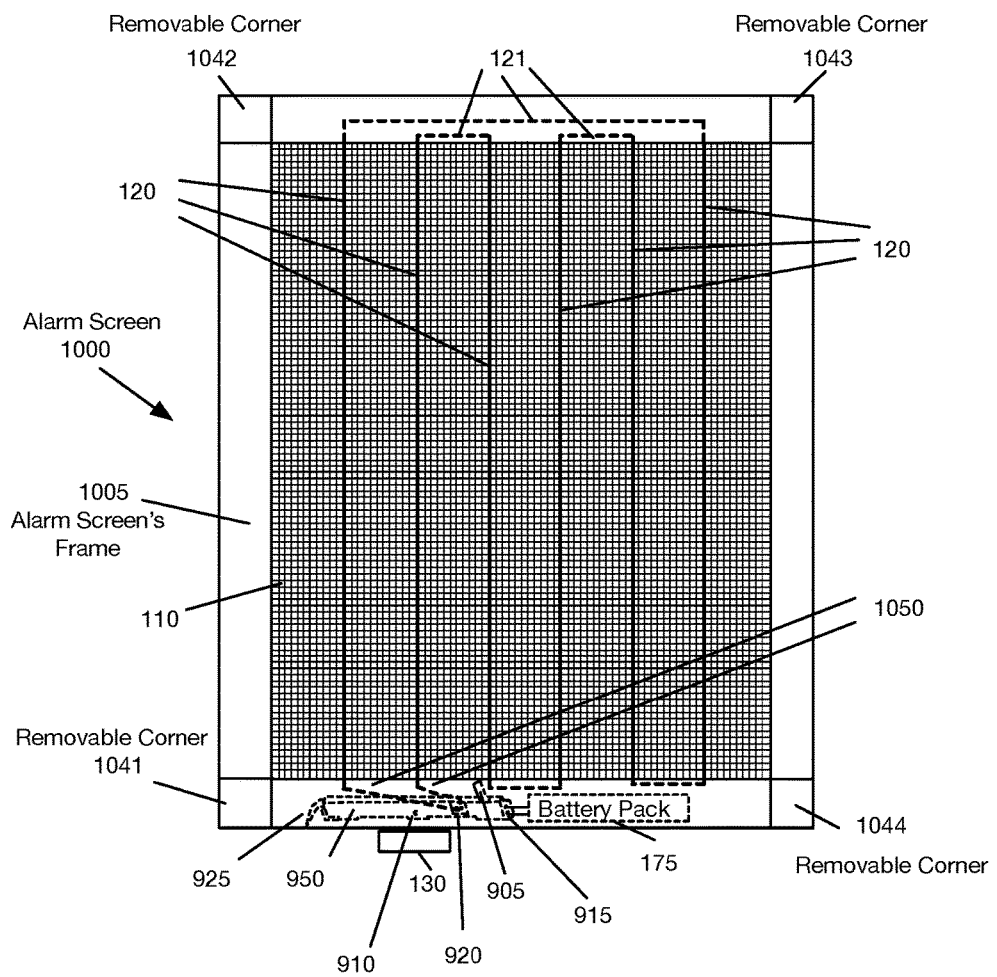

The alarm screen's frame in some of the present embodiments includes one or more removable corners to facilitate installation of the circuit board and the battery pack inside the hollow portion of the frame. FIGS. 10A-10B are schematic front views of an alarm screen 1000 with one or more removable frame corners for embedding a wireless transmitter inside the frame, according to various aspects of the present embodiments. With reference to FIG. 10A, the alarm screen's frame 1005 may include one or more removable corners 1041-1044.

Figure 11:
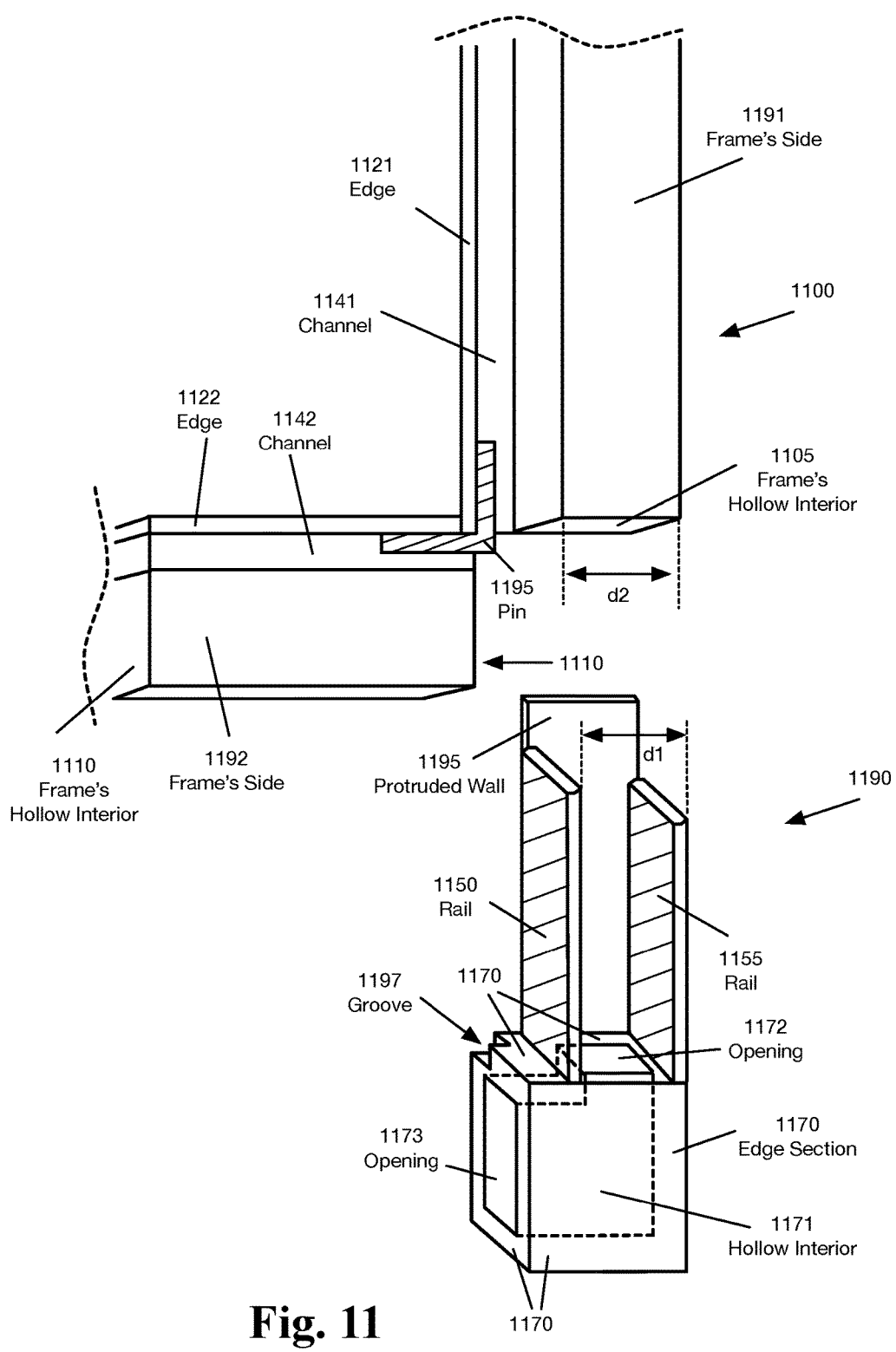
FIG. 11 is a perspective view of a portion of an alarm screen's frame with a removable corner, according to various aspects of the present embodiments.

In some embodiments, the removable corners 1041-1044 may include two rails (e.g., made of a flexible or bendable material such as plastic, aluminum, etc.) to snugly fit into the hollow interior of the frame 1005. FIG. 11 is a perspective view of a portion of an alarm screen's frame with a removable corner, according to various aspects of the present embodiments.

With reference to FIG. 11, a portion 1100 of an alarm screen's frame is shown to include the frame's edges 1121-1122, the frame side's 1191-1192, and the channels 1141-

1142. The edge 1121, the channel 1141, and the frame's side 1191 may be manufactured as one piece (e.g., one piece of aluminum, aluminum alloy, wood, or other material). The edge 1122, the channel 1142, and the frame's side 1192 may be manufactured as another piece. The two pieces may be connected together by a pin 1195 when the frame is assembled together. The pin may be made of plastic, metal, rubber, etc., and may prevent different sides of the frame to be separated.

The removable corner 1190 may be made of similar material as the frame and may be made such that the removable corner may snugly fit inside the frame's hollow interior 1105. The removable corner 1190 may include the rails 1150 and 1155 that may be attached to a wall 1195 that may protrude from one side of the removable corner 1190. The distance "d1" between the two rails and the opening "d2" of the frame's hollow interior 1105 are made such that the two rails 1150 and 1155 may snugly fit into the hollow portion of the frame (e.g., may be forced in by hand). As an example, and without any limitations, the distance "d1" may be the same or slightly wider (e.g., a fraction of a millimeter, a millimeter, a few millimeters, etc.) than the distance "d2" such that the rails 1150 and 1155 may be forced to tightly fit inside the frame's hollow portion 1105. The removable corner 1190 may include a groove 1197 to fit over the pin 1195 when the removable corner 1190 is inserted inside the frame's hollow interior 1105.

One novelty of the system of FIG. 11, among other features, is that the pin 1195 (and not the removable corner 1190) is used to hold the frame's two sides 1191 and 1192 together. The removable corner 1190 is, therefore, not required to hold the frame's two sides 1191 and 1192 together. Another novelty of the system of FIG. 11, among other features, is that the removable corner 1190 has rails (such as rails 1150 and 1155) and a protruding wall (such as the protruding wall 1195) only on one side, which allows the removable corner 1190 to be inserted into and removed from the frame's hollow interior 1105 without separating the frame's two sides 1191 and 1192 from each other and/or from ripping the mesh from the frame. The alarm screen's frame in some embodiments may have one or more removable corners 1190 and one or more pins 1195 as shown in FIG. 11.

The removable corner 1190 may include an edge section 1170. In some embodiments, the edge section 1170 may be solid (not shown). In the embodiments depicted in FIG. 11, the edge section includes a hollow interior (or cavity) 1171 that may have an opening 1172 to provide access to the hollow interior 1105 of the frame's side 1191, once the removable corner 1190 is inserted inside the frame's hollow interior 1105. In addition to, or in lieu of the opening 1172, the hollow interior 1171, in some embodiments, may include an opening 1173 to provide access to the hollow interior 1110 of the frame's side 1192, once the removable corner 1190 is inserted inside the frame's hollow interior 1105.

The hollow interior 1171 provides the advantage that the circuit board may be inserted in the hollow interior 1171 (e.g., and without any limitation, as described below with reference to FIGS. 14 to 16B). The hollow interior 1171 and the openings 1172-1173 provide the advantage and the flexibility to embed one or more of the circuit board (or the housing and the circuit board), the battery pack, and/or the antenna in either of the hollow interior 1171, the hollow interior 1105, and/or the hollow interior 1110 while the other one of circuit board (or the housing and the circuit board), the battery pack, and/or the antenna may be embedded in the other of the hollow interior 1171, the hollow interior 1105, and/or the hollow interior 1110 (e.g., and without any limitation, as described below with reference to FIGS. 14 to 16B).

The removable corners shown in FIGS. 10A-10B, and 12A to 16 may have a mechanism similar to the removable corner 1190 to snugly fit in the hollow interior of the alarm screen's frame. In other embodiments, the removable corners and the body of the frame may have other mechanisms such as, for example and without any limitations, matching pins and slots in order for the corners to be easily snapped into and removed from the corners of the frame.

With reference to FIG. 10A, two wires 1050 from the detection wire 120-121 loop may be brought out of the frame when the corner 1041 is removed. In some embodiments, the loose end of the detection wire 1050 may be connected to a male connector 1055. In some embodiments, each of the wires 1050 may be connected to a small metallic tip for connecting the wires to the detection wire connection ports 920 on the circuit board's housing 950. As shown in FIG. 10A, the battery pack is connected to the circuit board's housing 950 through the battery connection ports 915. In FIG. 10A, the circuit board 170 (FIG. 9) inside of the housing 950 is not shown for simplicity.

Although in the example of FIG. 10A and in several other examples with reference to the following figures, the circuit board that is embedded in an alarm screen is inside a housing, the invention is not limited to the use of a housing for the circuit board. In some aspects of the present embodiments, a battery pack may be connected to a circuit board (e.g., to the battery connector 325 of FIGS. 3A-3D) and the detection wire (e.g., the wire 1050) may be connected to the detection wire connector 330 of FIGS. 3A-3D without the circuit board being inside a housing. The battery pack and the circuit board may then be embedded in an alarm screen's frame without the use of a housing.

With reference to FIG. 10B, the battery pack 175 and the housing 950, which includes the circuit board, are placed in the hollow portion of the alarm screen's frame. As shown, the detection wire 1050 is connected to the detection wire connection ports 920. The housing is placed inside the frame 1005 such that the momentary tamper switch 180 touches the interior of the frame, thereby closing the momentary tamper switch. The reed switch marker 910 on the housing 950 may help aligning the location of the reed switch 125 (FIG. 9) with the magnet 130.

The anchor 925 may fix the housing 950 to the interior of the frame 1005. As described below with reference to FIGS. 17A-17B, the housing, in some embodiments, may include more than one anchor to fix the housing within the frame 1005. As shown, the removable corner 1041 may be placed at the corner of the frame 1005 after the battery pack 175 and the housing 950 are placed inside the frame 1005.

Figure 12A:
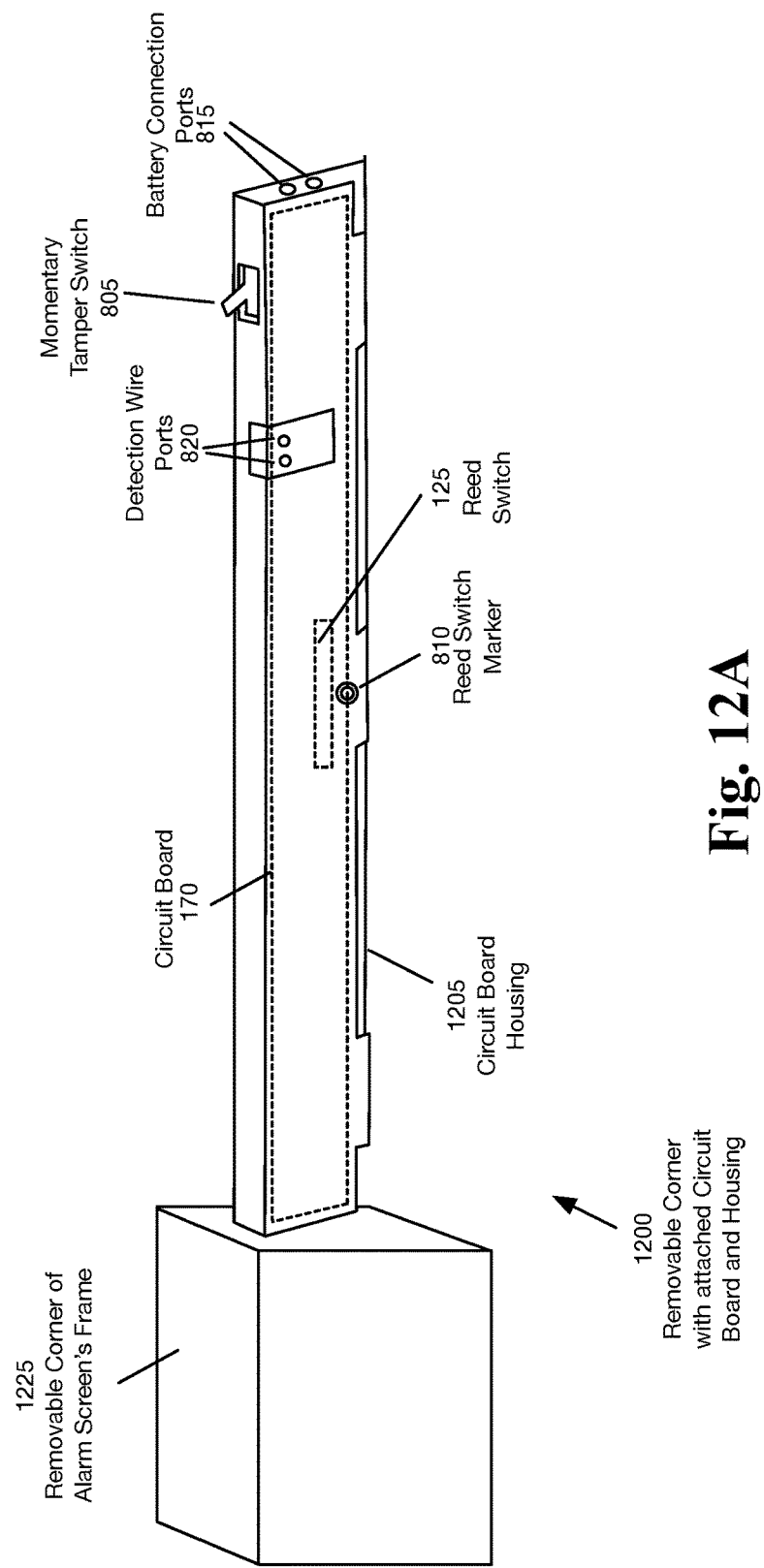
FIG. 12A is a perspective view of a housing for a circuit board that is attached to a removable frame corner and may be embedded in an alarm screen's frame, according to various aspects of the present embodiments.

In some of the present embodiments, the circuit board's housing is attached to a removable corner that may be plugged into a corner of an alarm screen. FIG. 12A is a perspective view of a housing for a circuit board that is attached to a removable frame corner and may be embedded in an alarm screen's frame, according to various aspects of the present embodiments.

With reference to FIG. 12A, the circuit board housing 1205 covers a circuit board 170 with similar component as the circuit board in any of FIGS. 3A-3D and 9. The circuit board housing 1205 is connected to a removable corner 1225 of an alarm screen's frame, which may be similar to the removable corners 1041-1044 of FIGS. 10A-10B. The removable corner 1225 may have similar mechanisms for attaching to a corner of an alarm screen as described above with reference to FIGS. 11 and 10A-10B.

The circuit board housing 1205 and the removable corner 1225 may be connected together to form a single unit 1200. In some of the present embodiments, the circuit board housing 1205 and the removable corner 1225 are manufactured as one unit. In some of the present embodiments, the circuit board housing 1205 and the removable corner 1225 are manufactured separately and are connected to each other permanently. For example, the circuit board housing 1205 and the removable corner 1225 may be connected together with adhesive or glue. In some of the present embodiments, the circuit board housing 1205 and the removable corner 1225 may be connected together by a precisely molded corner unit to hold the circuit board in place. In some of the present embodiments, the circuit board housing 1205 and the removable corner 1225 may be connected together by a set of pins or screws to hold them tightly together but may be easily separated from each other. In some of the present embodiments, the circuit board housing 1205 and the removable corner 1225 may be connected together by a set of slots and pins. In some embodiments, the housing 1205 may not have an anchor (such as the anchor 925 of FIG. 9) since the removable corner 1225 holds the housing 1205 in place once the removable corner 1225 and the housing 1205 are installed on an alarm screen.

As described above with reference to FIGS. 10A-10B, a circuit board, in some aspects of the present embodiments, may be connected to a battery pack and embedded inside an alarm screen's frame without a housing. With reference to FIG. 12A, the removable corner 1225 may be directly connected to the circuit board 170 without the need for a housing. Any of following examples that uses a removable corner 1225 of an alarm screen attached to a housing 1205 with a circuit board 170 inside is applicable to a removable corner 1225 of an alarm screen that is attached to a circuit board 170 without a housing.

Figure 12B:
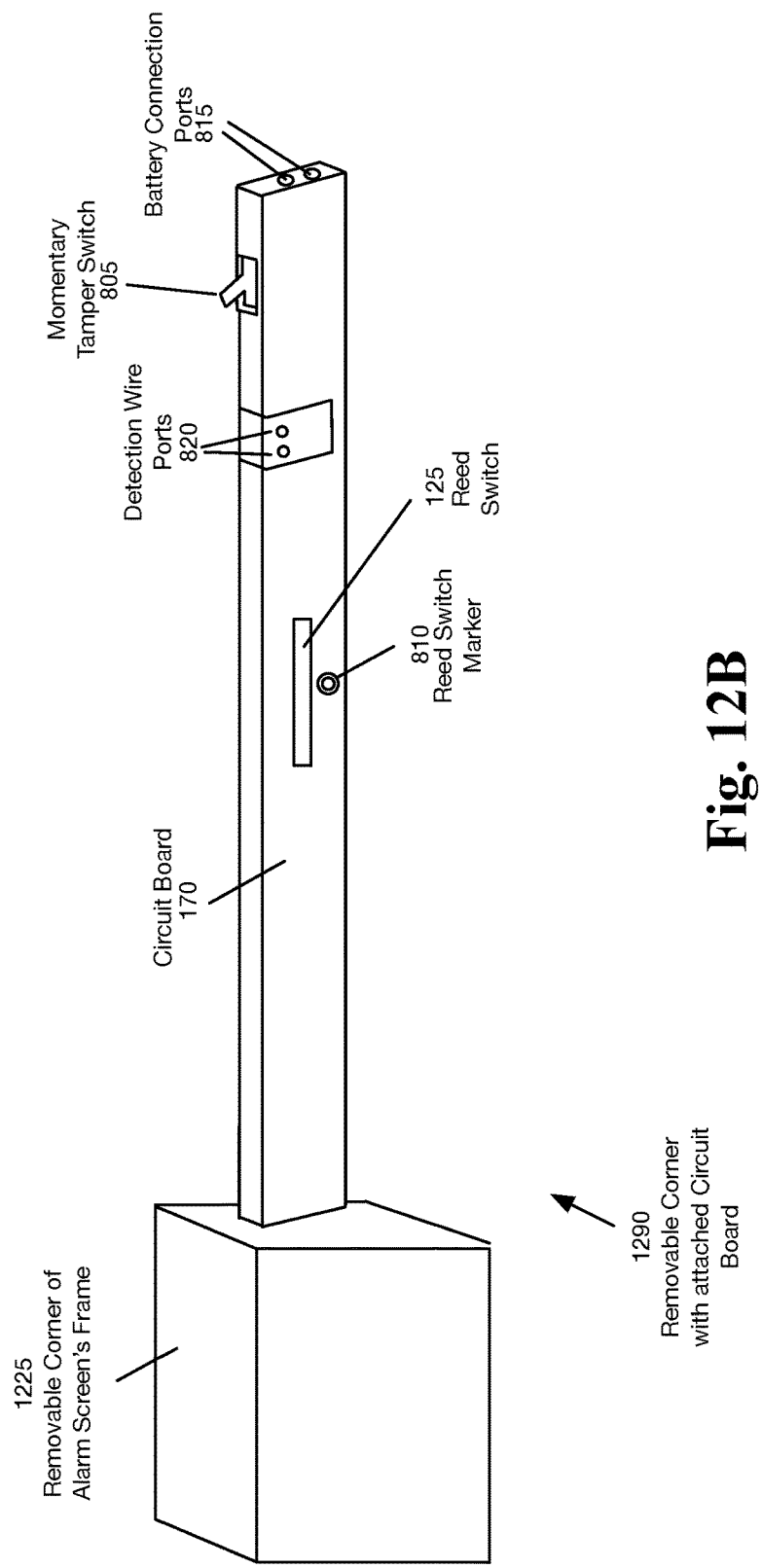
FIG. 12B is a perspective view of a circuit board that is attached to a removable frame corner and may be embedded in an alarm screen's frame, according to various aspects of the present embodiments.

FIG. 12B is a perspective view of a circuit board that is attached to a removable frame corner and may be embedded in an alarm screen's frame, according to various aspects of the present embodiments. With reference to FIG. 12B, the circuit board 170 and the removable corner 1225 may be connected together to form a single unit 1290. The circuit board 170 may have similar component as the circuit board in any of FIGS. 3A-3D and 9.

The circuit board 170 in FIG. 12B is not enclosed in a housing and is connected to a removable corner 1225 of an alarm screen's frame, which may be similar to the removable corner 1225 of FIG. 12A. The circuit board 170 and the removable corner 1225 of FIG. 12B may be connected together, for example and without any limitations, by similar techniques as described above for connecting the housing 1205 and the removable corner 1225 with reference to FIG. 12A. Although several examples are provided below that show the removable corner with the attached circuit board and housing 1200 of FIG. 12A, the invention is equally applicable to the removable corner with the attached circuit board 1290 of FIG. 12B.

Figure 13A:
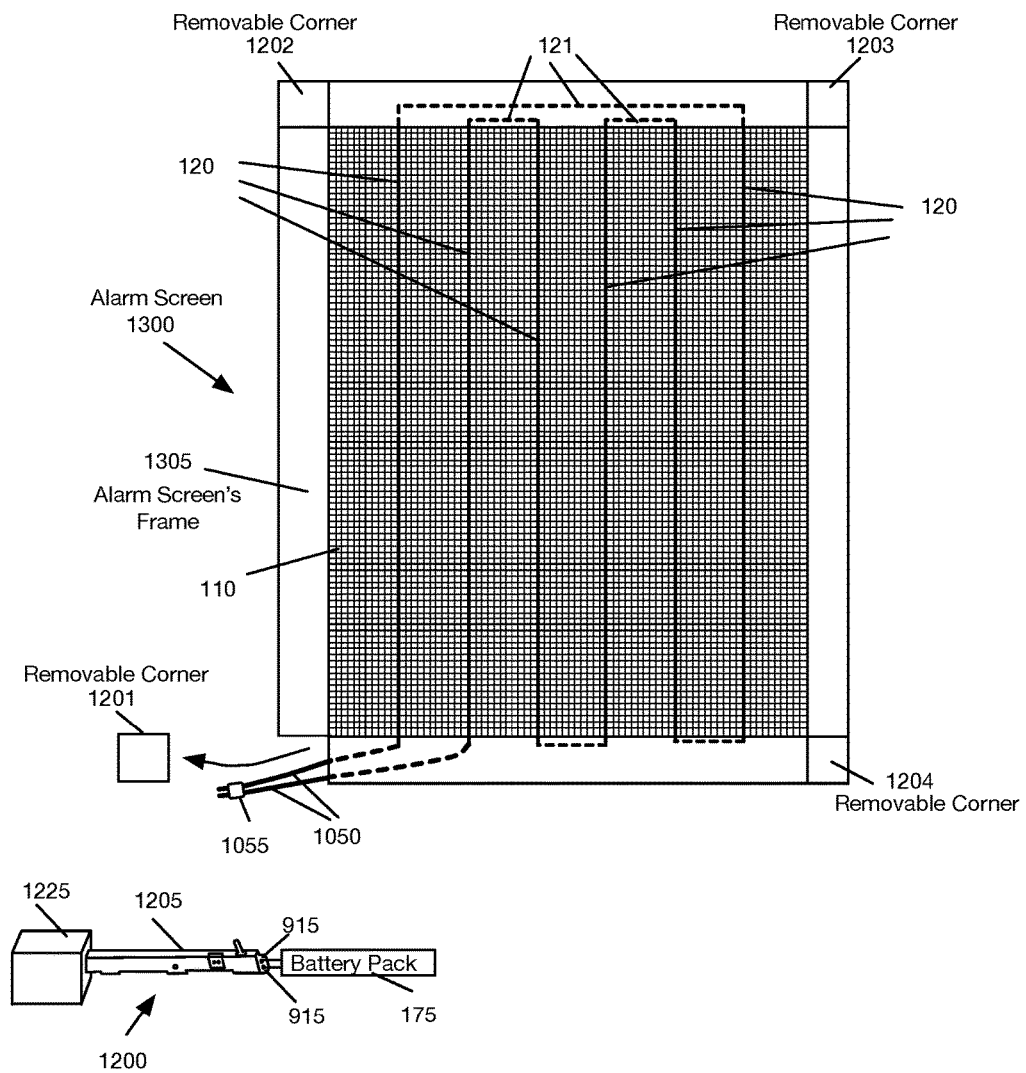
FIGS. 13A-13B are schematic front views of an alarm screen with one or more removable frame corners for embedding a wireless transmitter inside the frame, according to various aspects of the present embodiments.
Figure 13B:
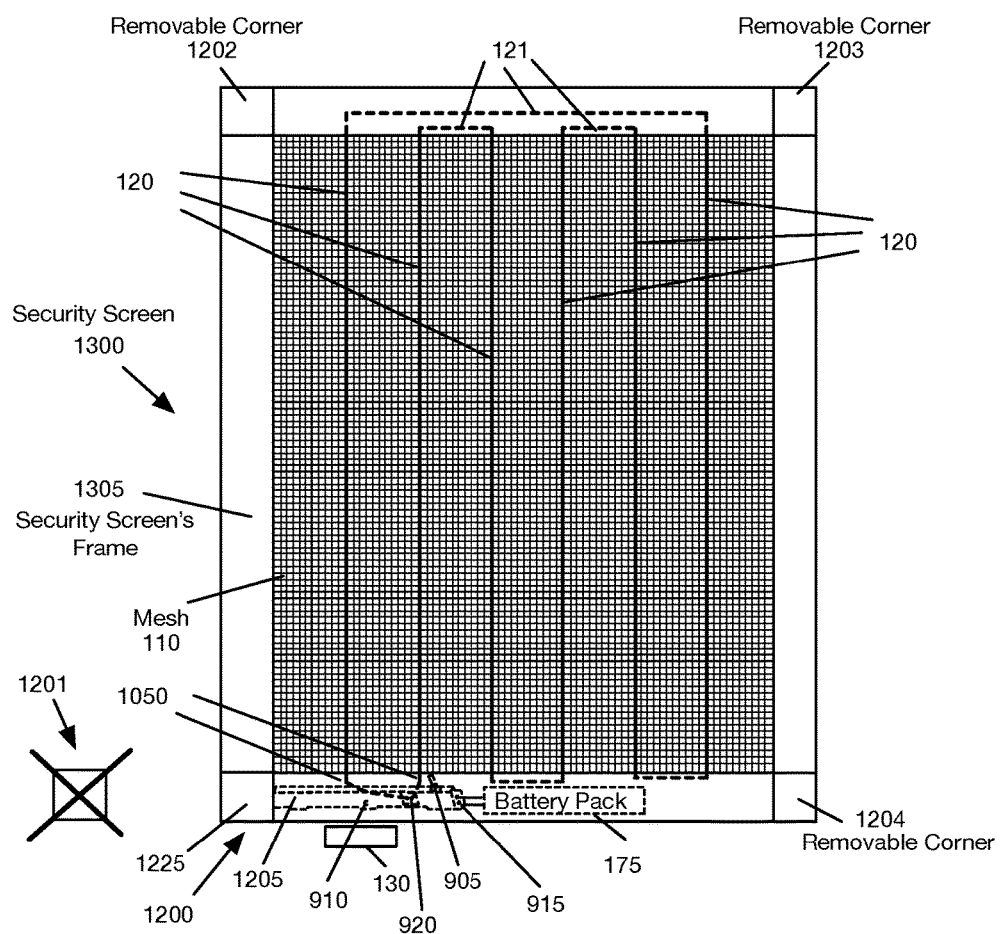

FIGS. 13A-13B are schematic front views of an alarm screen 1300 with one or more removable frame corners for embedding a wireless transmitter inside the frame, according to various aspects of the present embodiments. With reference to FIG. 13A, the alarm screen's frame 1005 may include one or more removable corners 1041-1044. The two wires 1050 from the detection wire loop may be brought out of the frame when the corner 1041 is removed.

As shown in FIG. 13A, the removable corner with attached circuit board and housing 1200 and the battery pack 175 may be connected together through the battery connection ports 915 for being embedded into the alarm screen's frame 1305. In FIG. 13A, the circuit board 170 (FIG. 9) inside of the housing 950 is not shown for simplicity.

With reference to FIG. 13B, the battery pack 175 and the removable corner and the attached housing 1200 are placed in the hollow portion of the alarm screen's frame 1305. As shown, the detection wire 1050 is connected to the detection wire connection ports 920. The housing is placed inside the frame 1305 such that the momentary tamper switch 180 touches the interior of the hollow frame, thereby closing the momentary tamper switch 180. The reed switch marker 910 on the housing 950 may help aligning the location of the reed switch 125 (FIG. 9) with the magnet 130.

The single unit 1200 that includes the removable corner 1225 attached to the housing 1205 are held in place by the removable corner 1225 tightly fitting the corner of the alarm screen's frame 1305. The removable corner 1201, which was not attached to a housing, is not needed anymore and may be discarded.

Figure 14:
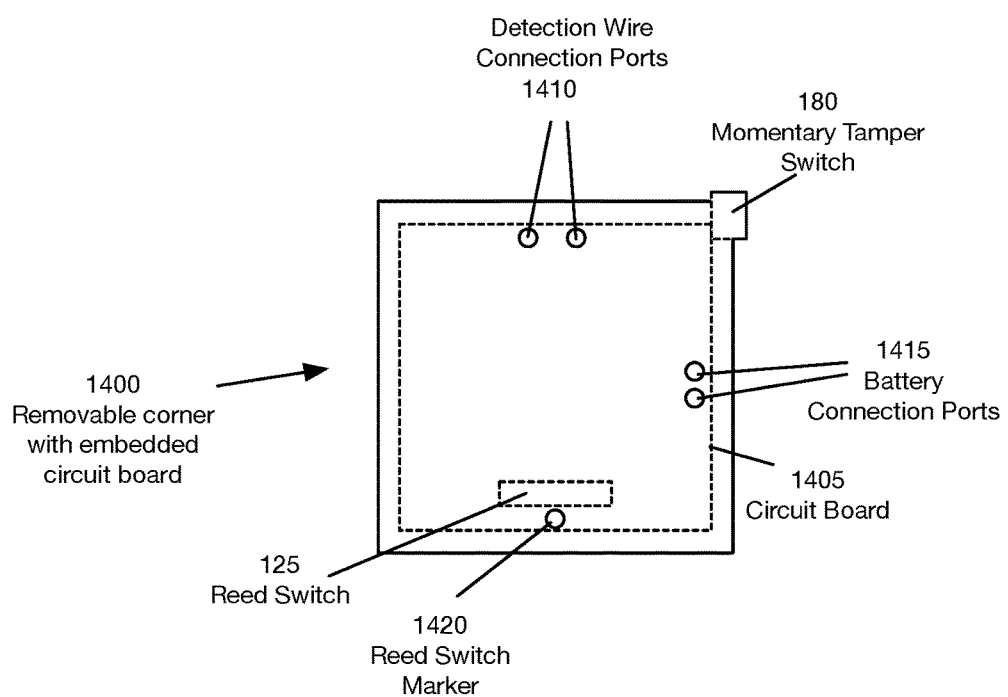
FIG. 14 is a schematic front view of a removable corner of an alarm screen's frame with a circuit board including a wireless transmitter inside, according to various aspects of the present embodiments.

In some of the present embodiments, the circuit board for an alarm screen may be embedded in a removable corner of the alarm screen's frame. FIG. 14 is a schematic front view of a removable corner of an alarm screen's frame with a circuit board including a wireless transmitter inside, according to various aspects of the present embodiments. With reference to FIG. 14, the removable corner 1400 may be used to fit in a corner of an alarm screen's frame. The removable corner 1400 may have precise molding (or other mechanisms described above with reference to the removable corners 1190 and 1201-1204) to ensure a snug fit at the corner of the alarm screen's frame.

The removable corner 1400 may have a cavity (or a hollow portion) and may have a circuit board 1405 inside the cavity. The circuit board 1405 may have similar components as one of the circuit boards 170 of FIGS. 3A-3D. In some of the present embodiments, the removable corner 1400 may include a marker 1420 to identify the approximate location of the reed switch 125 inside the removable corner 1400. The marker 1420 may be used to place a magnet on a wall, door/window frame, or door/window casing such that the reed switch 125 and the magnet are located in proximity of each other. In some embodiments, the circuit board 1405 may be sealed inside the cavity of the removable corner. In other embodiments, the cavity may have one or more openings (e.g., and without any limitation, such as the opening 1172 and/or the opening 1173 of FIG. 11) to provide access to the hollow interiors of the alarm screen's frame.

The removable corner 1400 may expose the detection wire connection ports 1410 for connecting to the detection wire of an alarm screen. The removable corner 1400 may expose the battery connection ports 1415 for connecting to a battery pack. The removable corner 1400 may partially expose a momentary tamper switch 180 at an appropriate location (e.g., without any limitations, at a corner of or on a side of the removable corner 1400). The momentary tamper switch 180 may close after the removable corner 1400 is installed at a corner of an alarm screen frame and the momentary tamper switch 180 engages with the interior of the alarm screen frame, the alpine, and/or the mesh of the alarm screen. Some embodiments may use a "system on a chip," microelectromechanical systems (MEMS) technology, and/or nanotechnology to minimize the size of the components of the circuit board 1405 in order to better fit the components inside the cavity of the removable corner of the frame.

Figure 15A:
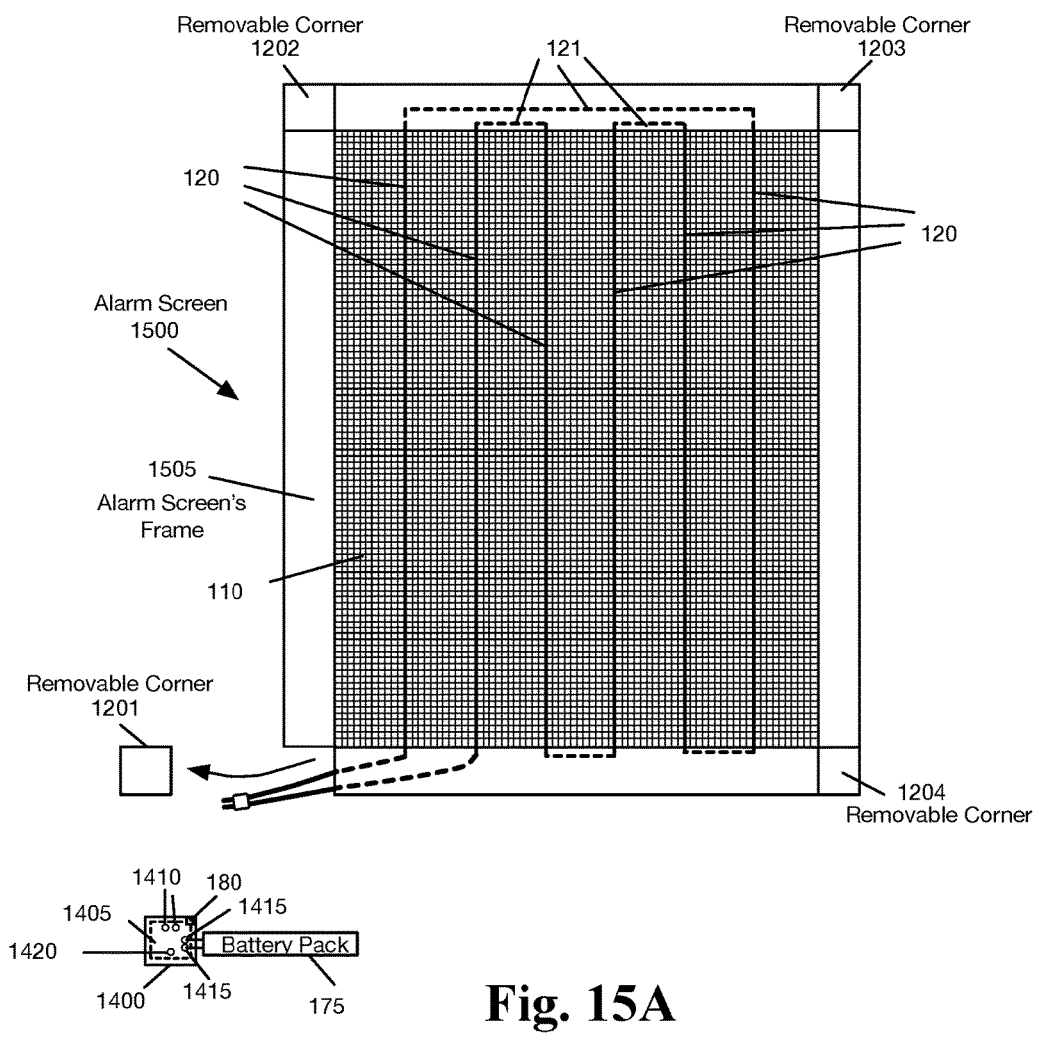
FIGS. 15A-15B are schematic front views of an alarm screen for which one of the removable corners may be replaced with a removable corner that includes a circuit board with alarm components, according to various aspects of the present embodiments.
Figure 15B:
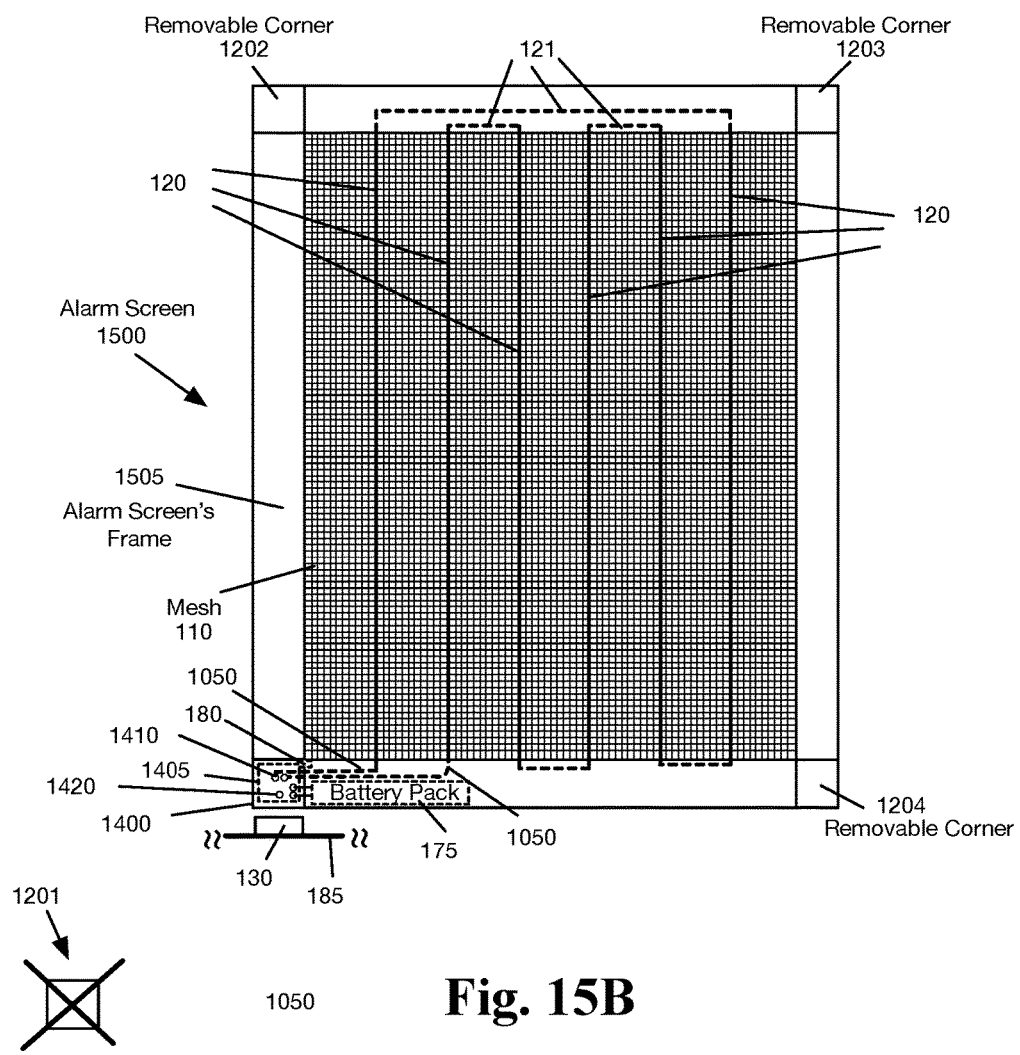

FIGS. 15A-15B are schematic front views of an alarm screen 1500 for which one of the removable corners may be replaced with a removable corner that includes a circuit board with alarm components, according to various aspects of the present embodiments. With reference to FIG. 15A, the alarm screen's frame 1505 may include one or more removable corners 1041-1044. The two wires 1050 from the detection wire's loop may be brought out of the frame when the corner 1041 is removed.

As shown in FIG. 15A, the removable corner with the circuit board inside 1400 circuit board and the battery pack 175 may be connected together through the battery connection ports 1415 for being embedded into the alarm screen's frame 1505. With reference to FIG. 15B, the battery pack 175 and the removable corner 1400 with the embedded circuit board 1405 are placed in the hollow portion of the alarm screen's frame 1505. As shown, the detection wire 1050 is connected to the detection wire connection ports 1410. When the removable corner 1400 is placed inside the frame 1505, the momentary tamper switch 180 may touch the interior of the hollow frame 1505, thereby closing the momentary tamper switch 180. The reed switch marker 14200 on the removable corner 1400 may help installing the magnet 130 such that the magnet 130 and the reed switch inside the removable corner 1400 may be aligned. In some of the present embodiments, the removable corner 1400 (FIGS. 14 and 15A-15B) may not include a reed switch. In these embodiments, one or more reed switches, external to the circuit board 1405 may be embedded in the alarm screen's frame, for example, as described above with reference to FIGS. 4-5. The removable corner 1201, which does not include a circuit board, is not needed anymore and may be discarded.

Figure 16:
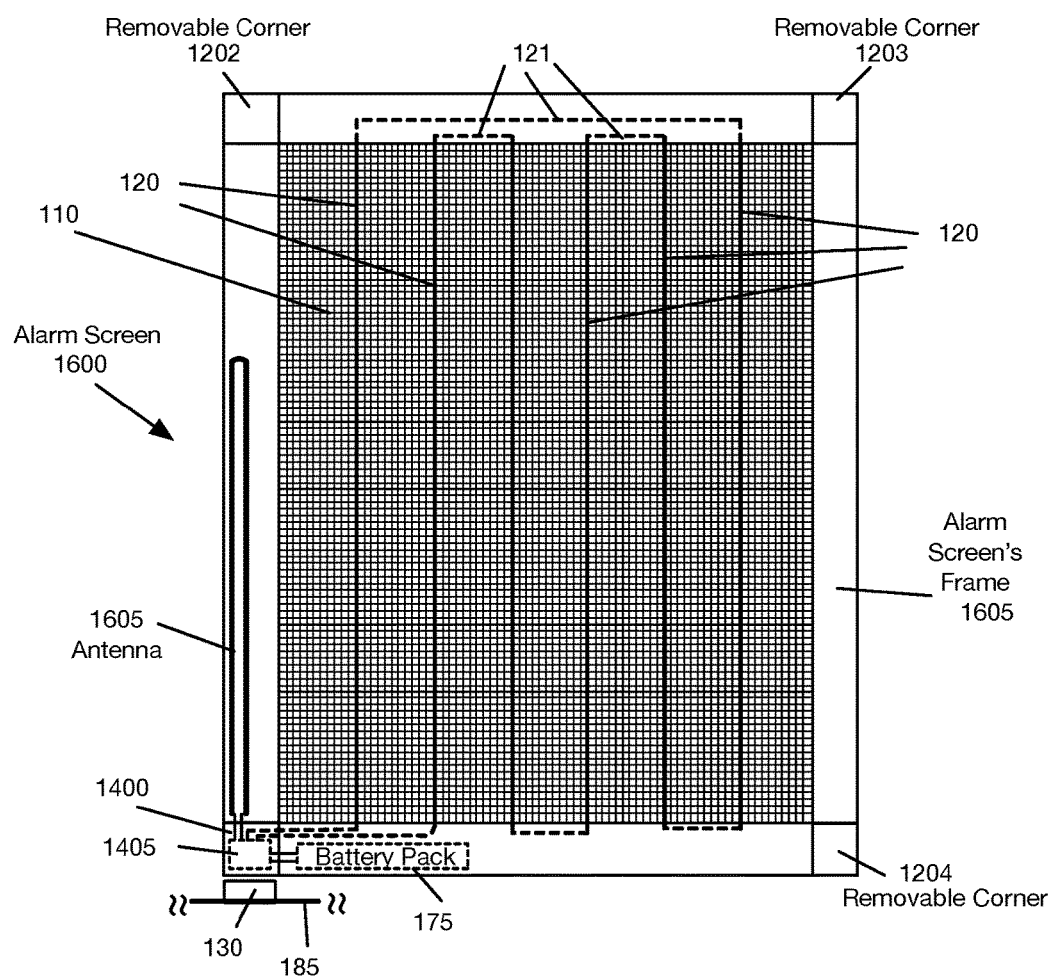
FIG. 16 is a schematic front view of an alarm screen with a removable corner that includes a circuit board for the alarm screen, and an antenna that is placed outside the circuit board within a hollow portion of the alarm screen's frame, according to various aspects of the present embodiments.

FIG. 16 is a schematic front view of an alarm screen with a removable corner that includes a circuit board for the alarm screen, and an antenna that is placed outside the circuit board within a hollow portion of the alarm screen's frame, according to various aspects of the present embodiments. With reference to FIG. 16, the antenna 1605 is placed within the hollow portion of the alarm screen's frame 1605 outside the removable corner 1400. The embodiment of FIG. 16 provides the advantage that the circuit board 170 without an antenna inside may be smaller and easier to fit inside the removable corner 1400.

In some embodiments, the antenna may be overlaid over the mesh 110 or interwoven within the mesh 110, for example, as described above with reference to FIG. 7. In some embodiments, the antenna may be placed inside the channel under the spline, for example, as described above with reference to FIG. 8. In some embodiments, the antenna may be placed inside the removable corner 1600 but outside of the circuit board 1405.

Figure 17A:
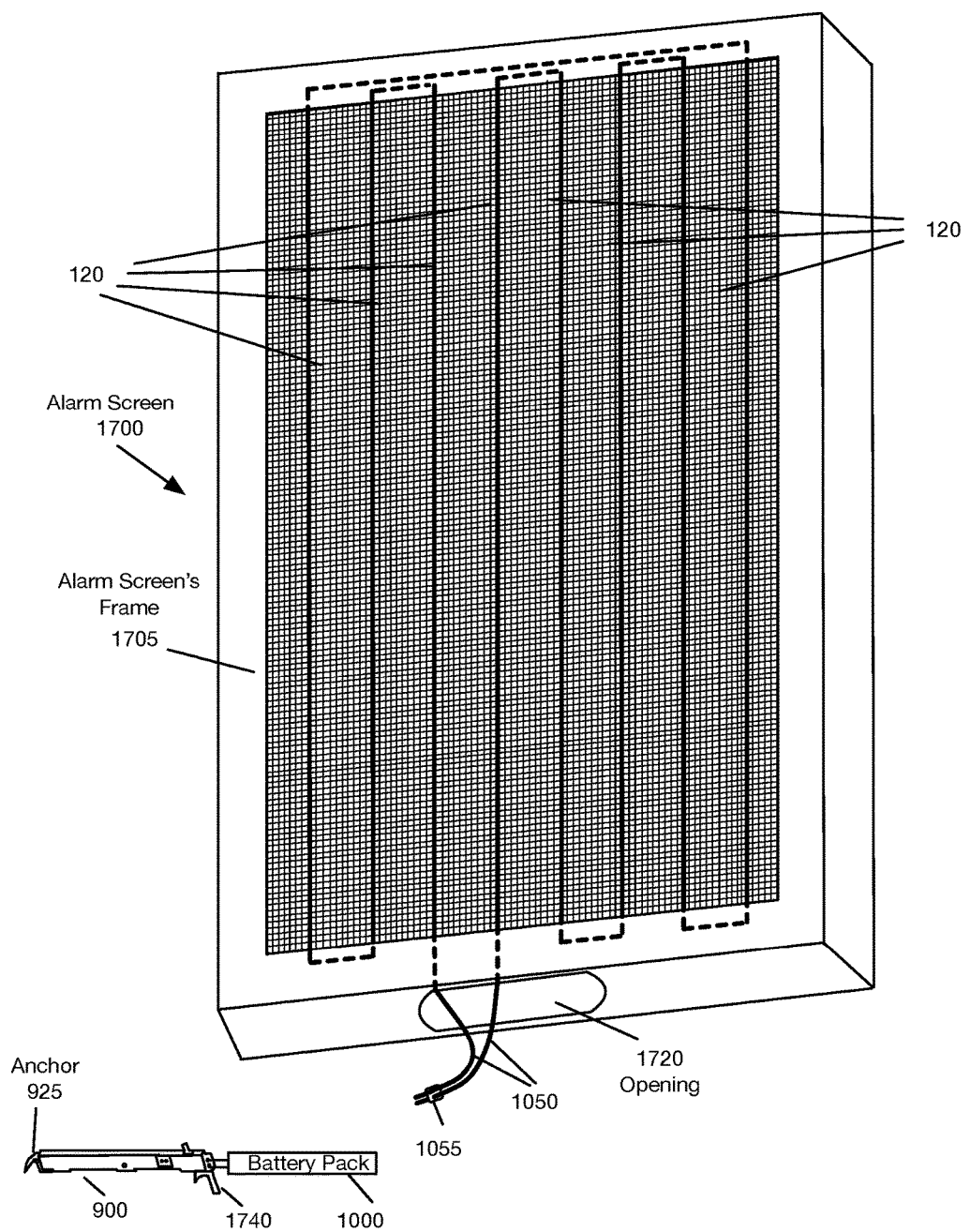
FIGS. 17A-17B are perspective views of an alarm screen that includes an embedded wireless transmitter and has an opening for placing the wireless transmitter inside the alarm screen's frame, according to various aspects of the present embodiments.
Figure 17B:
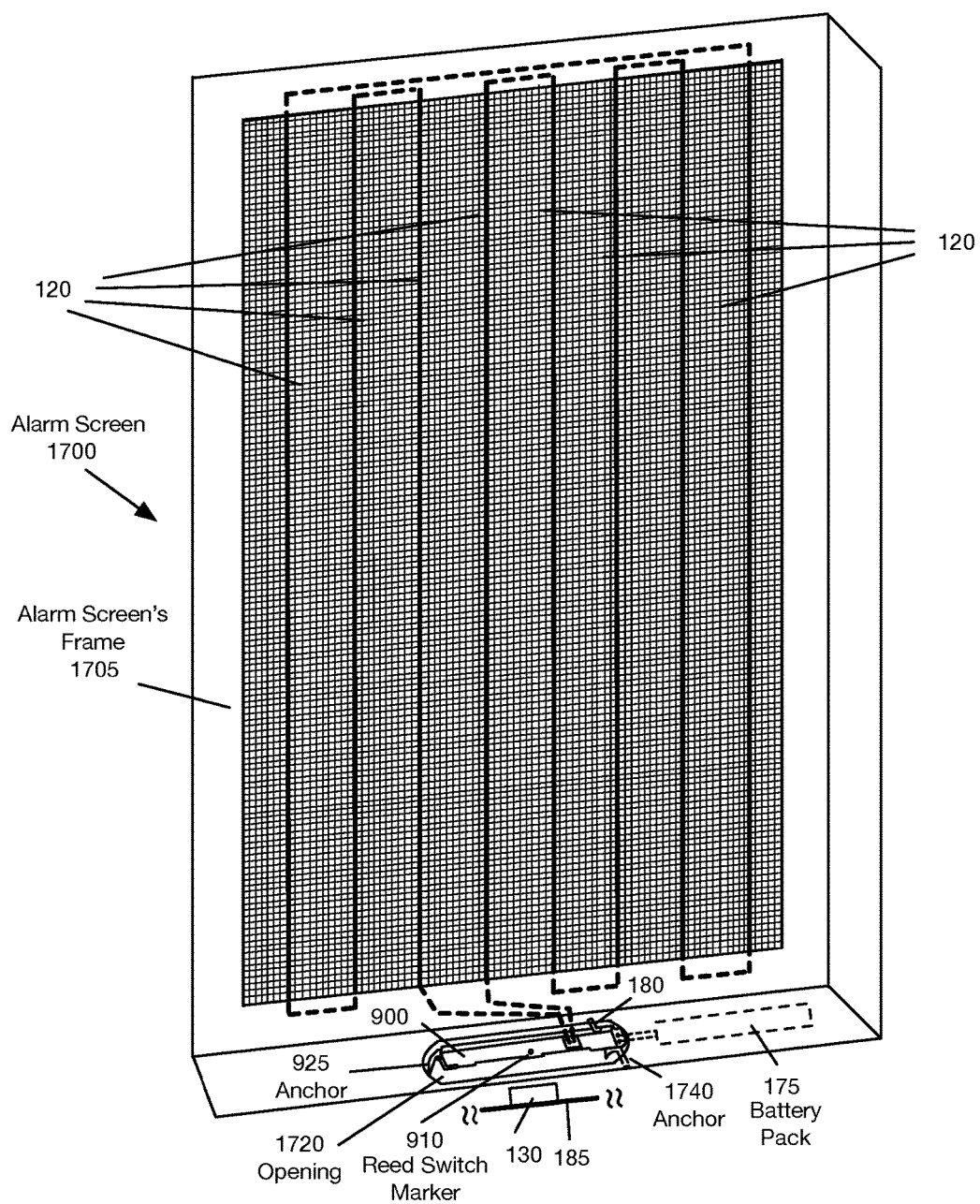

The alarm screen's frame, in some embodiments, may include an opening that is large enough to embed the battery pack and the housing with the circuit board inside (or the battery pack and the circuit board without a housing) inside the alarm screen's frame. FIGS. 17A-17B are perspective views of an alarm screen 1700 that includes an embedded wireless transmitter and has an opening for placing the wireless transmitter inside the alarm screen's frame, according to various aspects of the present embodiments.

With reference to FIG. 17A, the alarm screen's frame 1705 has a slotted opening 1720 that is large enough for passing the housing 900 and the battery pack 175 through, in order to embed the housing 900 and the battery pack 175 inside the alarm screen's frame 1705. The slotted opening 1720 may be drilled on the frame in order to allow access to the hollow interior of the frame, for example and without any limitations, when the frame is made of aluminum, aluminum alloy. The opening 1720 may be carved out from the frame when the frame has a solid body, for example and without any limitations, when the frame is made of wood. When the frame has a solid body, a cavity large enough to fit both the circuit board and the battery pack may be carved inside the frame. Although the opening 1720 in FIGS. 17A and 17B is shown in the bottom of the alarm screen's frame, the opening 1720, in different embodiments, may be made anywhere in the body of the alarm screen's frame.

As shown, the housing with the circuit board inside may be connected to the battery pack 175 for insertion through the opening 1720. In some of the present embodiments, the housing 900 may have one or more anchors 925 and 1740 for securing the housing once the housing is placed inside the frame 1705.

With reference to FIG. 17B, the battery pack 175 and the housing 900 are placed inside the alarm screen's frame 1705 through the opening 1720. The anchor 925 and/or 1740 may be used to secure the housing to the interior of the alarm screen's frame 1705. In the example of FIG. 17B, the momentary tamper switch is in the closed position when it touches the interior of the alarm screen's frame 1705. The magnet 130 may be installed on a wall or a door/window casing 185 using the reed switch marker 910 to be in the proximity of the reed switch, which is inside the housing.

The above description presents the best mode contemplated for carrying out the present embodiments, and of the manner and process of practicing them, in such full, clear, concise, and exact terms as to enable any person skilled in the art to which they pertain to practice these embodiments. The present embodiments are, however, susceptible to modifications and alternate constructions from those discussed above that are fully equivalent. Consequently, the present invention is not limited to the particular embodiments disclosed. On the contrary, the present invention covers all modifications and alternate constructions coming within the spirit and scope of the present disclosure.

What is claimed is:
1. An alarm screen, comprising:
   a frame comprising a hollow interior;
   a mesh attached to the frame;
   a detection wire for carrying electric current, wherein at least a portion of the detection wire is woven through or overlaid on the mesh;
   a processing unit embedded in the hollow interior of the frame; and
   a wireless transmitter embedded in the hollow interior of the frame and communicatively coupled to the processing unit;
   wherein the processing unit is configured to detect that no current is carried through the detection wire and to send a signal to the wireless transmitter; and
   wherein the wireless transmitter is configured to receive signals from the processing unit and wirelessly transmit the signals received from the processing unit.
2. The alarm screen of claim 1 further comprising a reed switch connected in series with the detection wire,
   wherein the reed switch is closed when the reed switch is in proximity of a magnet that is installed outside the alarm screen's frame, wherein when the detection wire is cut, the electric current stops flowing through the reed switch and the detection wire, and wherein the processing unit is configured to detect that the electric current is not flowing through the reed switch and the detection wire, and to send an alarm signal the wireless transmitter.

3. The alarm screen of claim 1 further comprising a reed switch connected in series with the detection wire, wherein the reed switch is closed when the reed switch is in a proximity of a magnet that is installed outside the alarm screen's frame, wherein the reed switch is opened when the reed switch is removed from the proximity of the magnet causing the electric current to stop flowing through the reed switch and the detection wire, and wherein the processing unit is configured to detect that the electric current is not flowing through the reed switch and the detection wire, and to send an alarm signal to the wireless transmitter.

4. The alarm screen of claim 1 further comprising a plurality of reed switches connected in series with the detection wire, wherein each reed switch is closed when the reed switch is in proximity of a corresponding magnet that is installed outside the alarm screen's frame, wherein when the detection wire is cut, the electric current stops flowing through the plurality of the reed switches and the detection wire, and wherein the processing unit is configured to detect that the electric current is not flowing through the plurality of reed switches and the detection wire, and to send an alarm signal the wireless transmitter.

5. The alarm screen of claim 1 further comprising a plurality of reed switches connected in series with the detection wire, wherein each reed switch is closed when the reed switch is in a proximity of a corresponding magnet that is installed outside the alarm screen's frame, wherein when a reed switch in the plurality of reed switches is removed from the proximity of the corresponding magnet, the reed switch is opened causing the electric current to stop flowing through the plurality of reed switches and the detection wire, and wherein the processing unit is configured to detect that the electric current is not flowing through the plurality of reed switches and the detection wire, and to send an alarm signal to the wireless transmitter.

6. The alarm screen of claim 1 further comprising one or more batteries embedded in the hollow interior of the frame and connected to the processing unit and the wireless transmitter, wherein the processing unit is configured to measure a voltage level of the one or more batteries, and to send an alarm signal to the wireless transmitter when the voltage level is below a threshold.

7. The alarm screen of claim 1 further comprising a circuit board for supporting the processing unit and the wireless transmitter, the alarm screen further comprising a normally open tamper switch installed on the circuit board, wherein the tamper switch is closed when the circuit board is embedded in the hollow interior of the frame and the tamper switch makes a contact with an interior of the alarm screen's frame, wherein the tamper switch is opened when the circuit board is removed from the hollow interior of the frame, and wherein the processing unit is configured to detect that the tamper switch is opened, and to send an alarm signal to the wireless transmitter.

8. The alarm screen of claim 1 further comprising at least one removable corner to fit in an opening to the hollow interior of the frame and to provide access to the hollow interior of the frame.

9. The alarm screen of claim 8 further comprising a circuit board for supporting the processing unit and the wireless transmitter, wherein the circuit board is connected to the removable corner.

10. The alarm screen of claim 8 further comprising:
a circuit board for supporting the processing unit and the wireless transmitter; and
a housing that surrounds the circuit board,
wherein the housing is connected to the removable corner.

11. The alarm screen of claim 1, wherein the processing unit and the wireless transmitter are on a same system on a chip (SoC).

12. The alarm screen of claim 1, wherein the processing unit and the wireless transmitter are made using one of a microelectromechanical systems (MEMS) technology and a nanotechnology to minimize a size of the processing unit and the wireless transmitter in order to fit the processing unit and the wireless transmitter in the hollow interior of the frame.

13. The alarm screen of claim 1 further comprising an opening made on the frame in order to provide access to the hollow interior of the frame to embed the processing unit and the wireless transmitter inside the hollow interior of the frame.

14. The alarm screen of claim 1, wherein the frame comprises a channel covered by a spline, wherein at least a portion of the detection wire passes through the channel under the spline.

15. An alarm screen, comprising:
a frame comprising a hollow interior;
a mesh attached to the frame;
a detection wire for carrying electric current, wherein at least a portion of the detection wire is woven through or overlaid on the mesh;
a removable corner to fit in an opening to the hollow interior of the frame, the removable corner comprising a hollow interior;
a processing unit embedded in the hollow interior of the removable corner; and
a wireless transmitter embedded in the hollow interior of the removable corner and communicatively coupled to the processing unit;
wherein the processing unit is configured to detect that no current is carried through the detection wire and to send a signal to the wireless transmitter; and
wherein the wireless transmitter is configured to receive signals from the processing unit and wirelessly transmit the signals received from the processing unit.

16. The alarm screen of claim 15, wherein the removable corner further comprises a plurality of rails for snugly fitting in the opening to the hollow interior of the frame.

17. The alarm screen of claim 16, wherein the removable corner comprises a plurality of sides, and wherein the removable corner only comprises rails on one of the plurality of sides of the removable corner.

18. The alarm screen of claim 15, wherein the processing unit and the wireless transmitter are on a same system on a chip (SoC).

19. The alarm screen of claim 15, wherein the processing unit and the wireless transmitter are made using one of a microelectromechanical systems (MEMS) technology and a nanotechnology to minimize a size of the processing unit and the wireless transmitter in order to fit the processing unit and the wireless transmitter in the hollow interior of the removable corner.

20. The alarm screen of claim 15, wherein the frame comprises a plurality of sides, the alarm screen comprising one or more pins, each pin for connecting two adjacent sides of the frame together.

* * * * *